US012622294B2

(12) United States Patent
Geyik et al.

(10) Patent No.: US 12,622,294 B2
(45) Date of Patent: May 5, 2026

(54) METHODS AND APPARATUS TO IMPROVE SIGNAL INTEGRITY PERFORMANCE IN INTEGRATED CIRCUIT PACKAGES

(71) Applicant: Intel Corporation, Santa Clara, CA (US)

(72) Inventors: Cemil Geyik, Gilbert, AZ (US); Kemal Aygun, Tempe, AZ (US); Yidnekachew Mekonnen, Chandler, AZ (US); Zhichao Zhang, Chandler, AZ (US); Suddhasattwa Nad, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 100 days.

(21) Appl. No.: 17/733,170

(22) Filed: Apr. 29, 2022

(65) Prior Publication Data

US 2023/0352416 A1    Nov. 2, 2023

(51) Int. Cl.
| | |
|---|---|
| *H01L 23/538* | (2006.01) |
| *H01L 23/00* | (2006.01) |
| *H01L 25/065* | (2023.01) |

(52) U.S. Cl.
CPC .......... *H01L 23/5386* (2013.01); *H01L 24/14* (2013.01); *H01L 24/16* (2013.01); *H01L 25/0655* (2013.01); *H01L 2224/1403* (2013.01); *H01L 2224/16227* (2013.01)

(58) Field of Classification Search
CPC ... H01L 2224/16227; H01L 2224/1403; H01L 25/0655; H01L 25/162; H01L 24/16;
H01L 24/14; H01L 23/5386; H01L 23/5383; H01L 23/5385; H01L 23/5389; H01L 23/642; H01L 21/4857; H01L 2924/1434

See application file for complete search history.

(56) References Cited

U.S. PATENT DOCUMENTS

| | | | |
|---|---|---|---|
| 10,103,054 | B2 | 10/2018 | Zhang et al. |
| 2014/0268614 | A1 | 9/2014 | Zhang et al. |
| 2017/0229407 | A1 | 8/2017 | Zu et al. |
| 2017/0324208 | A1 | 11/2017 | Popovic |
| 2018/0286824 | A1* | 10/2018 | Jeng .................... H01L 21/6835 |
| 2019/0131257 | A1 | 5/2019 | Kong et al. |
| 2020/0066641 | A1 | 2/2020 | Aygun et al. |

(Continued)

OTHER PUBLICATIONS

International Searching Authority, "International Search Report and Written Opinion," issued in connection with International App. No. PCT/CN2021/138186, dated Sep. 20, 2022, 8 pages.

(Continued)

*Primary Examiner* — Lawrence C Tynes, Jr.
(74) *Attorney, Agent, or Firm* — Hanley, Flight & Zimmerman, LLC

(57) ABSTRACT

Methods, apparatus, systems, and articles of manufacture to improve signal integrity performance in integrated circuit packages are disclosed. An integrated circuit (IC) package includes a substrate; a first conductive pad in a first metal layer in the substrate; and a second conductive pad in a second metal layer in the substrate. The first metal layer is adjacent the second metal layer with no intervening metal layers therebetween. The integrated circuit (IC) package further includes a conductive protrusion extending from the first conductive pad toward the second conductive pad.

22 Claims, 10 Drawing Sheets

(56) References Cited

U.S. PATENT DOCUMENTS

| | | | |
|---|---|---|---|
| 2020/0066692 | A1 | 2/2020 | Wolter et al. |
| 2021/0375738 | A1 | 12/2021 | Ovard et al. |
| 2023/0335510 | A1 | 10/2023 | Chiu et al. |

OTHER PUBLICATIONS

United States Patent and Trademark Office, "Non-Final Office Action," issued in connection with U.S. Appl. No. 18/570,455, dated Mar. 3, 2026, 10 pages.

* cited by examiner

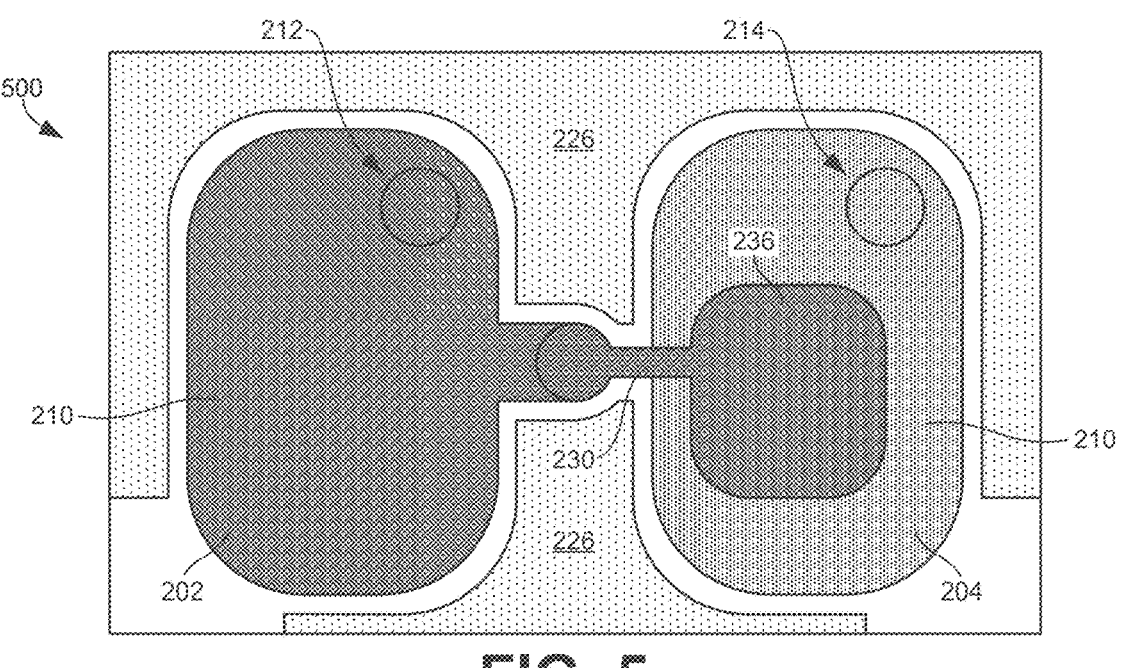
FIG. 5
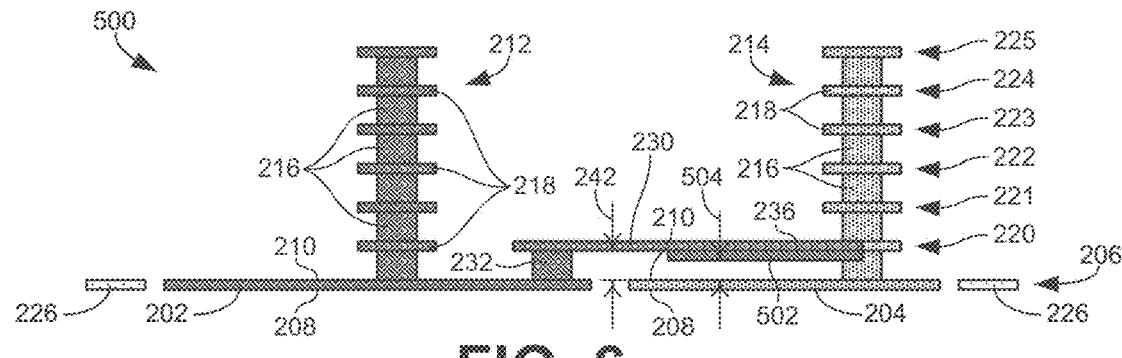
FIG. 6
FIG. 7

2500

PROCESSOR CIRCUITRY
2502

COMMUNICATION CHIP
2512

MEMORY
2504

BATTERY/POWER
2514

DISPLAY
2506

GPS CIRCUITRY
2518

AUDIO OUTPUT DEVICE
2508

AUDIO INPUT DEVICE
2524

OTHER OUTPUT DEVICE
2510

OTHER INPUT DEVICE
2520

ANTENNA
2522

METHODS AND APPARATUS TO IMPROVE SIGNAL INTEGRITY PERFORMANCE IN INTEGRATED CIRCUIT PACKAGES

FIELD OF THE DISCLOSURE

This disclosure relates generally to integrated circuits and, more particularly, to methods and apparatus to improve signal integrity performance in integrated circuit packages.

BACKGROUND

In many integrated circuit packages, one or more semiconductor dies are mechanically and electrically coupled to an underlying package substrate. Many such package substrates include an array of contacts (e.g., a ball grid array (BGA), a land grid array (LGA), or a pin grid array (PGA)) to enable the package to be mechanically and electrically coupled to a printed circuit board.

BRIEF DESCRIPTION OF THE DRAWINGS

FIGS. 5-7 illustrate a portion of another example package substrate constructed in accordance with teachings disclosed here.

Figure 1:
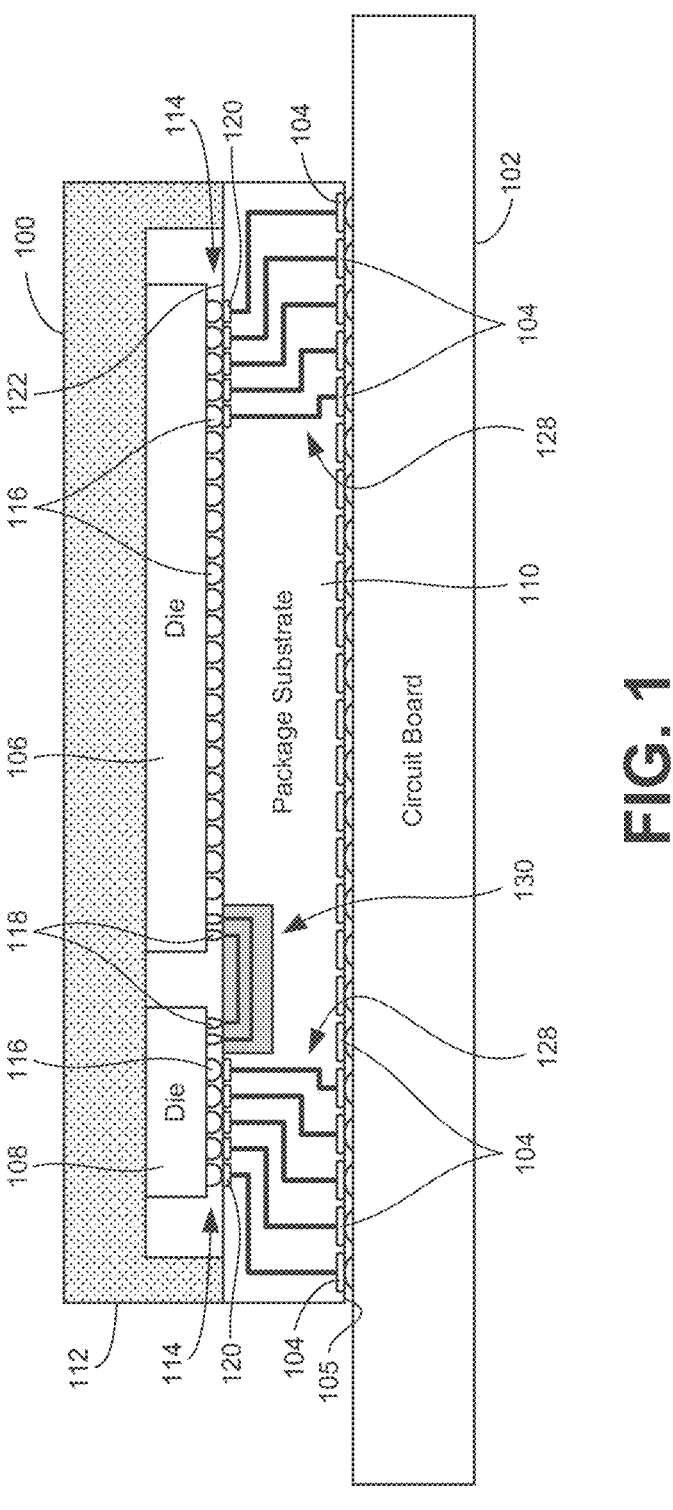
FIG. 1 illustrates an example integrated circuit (IC) package constructed in accordance with teachings disclosed herein.

In general, the same reference numbers will be used throughout the drawing(s) and accompanying written description to refer to the same or like parts. The figures are not necessarily to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular.

As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another.

Notwithstanding the foregoing, in the case of a semiconductor device, "above" is not with reference to Earth, but instead is with reference to a bulk region of a base semiconductor substrate (e.g., a semiconductor wafer) on which components of an integrated circuit are formed. Specifically, as used herein, a first component of an integrated circuit is "above" a second component when the first component is farther away from the bulk region of the semiconductor substrate than the second component.

As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween.

As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name.

As used herein, "approximately" and "about" refer to dimensions that may not be exact due to manufacturing tolerances and/or other real world imperfections. As used herein "substantially real time" refers to occurrence in a near instantaneous manner recognizing there may be real world delays for computing time, transmission, etc. Thus, unless otherwise specified, "substantially real time" refers to real time+/−1 second.

As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

As used herein, "processor circuitry" is defined to include (i) one or more special purpose electrical circuits structured to perform specific operation(s) and including one or more semiconductor-based logic devices (e.g., electrical hardware implemented by one or more transistors), and/or (ii) one or more general purpose semiconductor-based electrical circuits programmable with instructions to perform specific operations and including one or more semiconductor-based logic devices (e.g., electrical hardware implemented by one or more transistors). Examples of processor circuitry include programmable microprocessors, Field Programmable Gate Arrays (FPGAs) that may instantiate instructions, Central Processor Units (CPUs), Graphics Processor Units (GPUs), Digital Signal Processors (DSPs), XPUs, or microcontrollers and integrated circuits such as Application Specific Integrated Circuits (ASICs). For example, an XPU may be implemented by a heterogeneous computing system including multiple types of processor circuitry (e.g., one or more FPGAs, one or more CPUs, one or more GPUs, one or more DSPs, etc., and/or a combination thereof) and application programming interface(s) (API(s)) that may assign computing task(s) to whichever one(s) of the multiple types of processor circuitry is/are best suited to execute the computing task(s).

DETAILED DESCRIPTION

FIG. 1 illustrates an example integrated circuit (IC) package 100 constructed in accordance with teachings disclosed herein. In the illustrated example, the IC package 100 is electrically coupled to a circuit board 102 via an array of contact pads or lands 104 (e.g., a land grid array (LGA)) on a mounting surface (e.g., a bottom surface) 105 of the package 100. In this example, the landing pads 104 are flush with the bottom surface 105 of the package 100. In other examples, the landing pads 104 are inset relative to the bottom surface 105. In other examples, the landing pads 104 protrude beyond the bottom surface 105. In some examples, the IC package 100 may include bumps, balls, and/or pins, in addition to or instead of the landing pads 104, to enable the electrical coupling of the package 100 to the circuit board 102. In this example, the package 100 includes two semiconductor (e.g., silicon) dies 106, 108 that are mounted to a package substrate 110 and enclosed by a package lid or mold compound 112. While the example IC package 100 of FIG. 1 includes two dies 106, 108, in other examples, the package 100 may have only one die or more than two dies. The dies 106, 108 can provide any suitable type of functionality (e.g., data processing, memory storage, etc.). In some examples, the IC package 100 is a memory package (e.g., a double rate data (DDR) memory package and/or any other memory interface.

As shown in the illustrated example, each of the dies 106, 108 is electrically and mechanically coupled to the package substrate 110 via corresponding arrays of balls or bumps 114. The electrical connections between the dies 106, 108 and the package substrate 110 (e.g., the bumps 114) are sometimes referred to as first level interconnects. By contrast, the electrical connections between the IC package 100 and the circuit board 102 (e.g., the landing pads 104) are sometimes referred to as second level interconnects. In some examples, one or both of the dies 106, 108 may be stacked on top of one or more other dies and/or an interposer. In such examples, the dies 106, 108 are coupled to the underlying die and/or interposer through a first set of first level interconnects and the underlying die and/or interposer may be connected to the package substrate 110 via a separate set of first level interconnects associated with the underlying die and/or interposer. Thus, as used herein, first level interconnects refer to bumps between a die and a package substrate or a die and an underlying die and/or interposer.

As shown in FIG. 1, the bumps 114 of the first level interconnects include two different types of bumps corresponding to core bumps 116 and bridge bumps 118. As used herein, core bumps 116 refer to bumps on the dies 106, 108 through which electrical signals pass between the dies 106, 108 and components external to the IC package 100. More particularly, as shown in the illustrated example, when the dies 106, 108 are mounted to the package substrate 110, the core bumps 116 are physically connected and electrically coupled to contact pads 120 on an inner surface 122 of the substrate 110. The contact pads 120 on the inner surface 122 of the package substrate 110 are electrically coupled to the landing pads 104 on the bottom (external) surface 105 of the substrate 110 (e.g., a surface opposite the inner surface 122) via internal interconnects 128 within the substrate 110. As a result, there is a complete signal path between the bumps 114 of the dies 106, 108 and the landing pads 104 mounted to the circuit board 102 that pass through the contact pads 120 and the interconnects 128 provided therebetween. The interconnects 128 are shown as simple lines in the illustrated example of FIG. 1 for purposes of illustration. However, the metal interconnects 128 may be implemented by traces or electrical routing in different metal layers within the substrate 110 that are separated by layers of dielectric material. The traces in the different metal layers are electrically coupled by metal vias extending through the layers of dielectric material. Further detail regarding the particular structure of the interconnects 128 as constructed in accordance with teachings disclosed herein is provided below in connect with FIGS. 2-21.

As used herein, bridge bumps 118 refer to bumps on the dies 106, 108 through which electrical signals pass between different ones of the dies 106, 108 within the package 100. Thus, as shown in the illustrated example, the bridge bumps 118 of the first die 106 are electrically coupled to the bridge bumps 118 of the second die 108 via an interconnect bridge 130 embedded in the package substrate 110. As represented in FIG. 1, core bumps 116 are typically larger than bridge bumps 118. In some examples, the interconnect bridge 130 and the associated bridge bumps 118 are omitted.

Crosstalk between different signal paths associated with adjacent landing pads 104 can limit the bandwidth of data that can be transmitted along such paths. More particularly, horizontal interconnects including microstrip routing and vertical interconnects including plated through holes (PTHs), (micro) vias, and socket pins often inductively dominate far end crosstalk, which limits bandwidth. Thus, crosstalk is particularly problematic for IC packages that include interconnects associated with high-speed input/output (HSIO). Crosstalk is a limiting factor for single landed interconnects (e.g., as used in DDR technology) as well as for differential high speed lines (e.g., as used in peripheral component interconnect express (PCIe) technology). Past approaches to resolve crosstalk concerns present challenges and/or other limitations. For instance, crosstalk can be reduced by employing conservative pin map designs with a lower signal to ground ratio and wider spacing in vertical interconnects. However, such approaches increase pin count and rely on wider spacing that limits routing density and/or otherwise increases package form factors. Other solutions include the use of striplines instead of microstrips. While striplines significantly reduce crosstalk, their implementation comes at the cost of a higher layer count. Another option is to use shorter link lengths for horizontal interconnects, but such is not always possible depending on the package design. Another option is to use thinner dielectrics between metal layers. However, thinner dielectrics increase insertion loss, which significantly degrades performance. Examples disclosed herein include interconnects physically structured to reduce crosstalk relative to known package interconnect designs by providing localized regions of thinner dielectrics to increase mutual capacitance between signal paths while maintaining standard thicknesses for the dielectric at other regions in the package. More particularly, the dielectric thickness is reduced by including a conductive (e.g., metal) pad or plate between two adjacent metal layers that is electrically coupled to the metal in one of the two metal layers.

Generally speaking, crosstalk between a victim signal path (e.g., the signal path being excited to transmit a signal) and aggressor signal paths (e.g., the neighboring signal paths affecting the signal on the victim signal path) arises due to inductance between the signal paths. That is, as inductance between two signal paths increases, the crosstalk also increases. More particularly, far end crosstalk induced voltage ($V_f$) on a victim line can be expressed mathematically as follows:

$$V_f(t) = \frac{t_f}{2}\left(\frac{C_m}{C_s} - \frac{L_m}{L_s}\right)\frac{dV_i(t-t_f)}{dt} \qquad (1)$$

where $t_f$ is the time of flight, V is the aggressor input voltage, $C_m$, $C_s$, $L_m$, and $L_s$ are the mutual- and self-capacitance, and mutual- and self-inductance, respectively. Equation 1 indicates that far end crosstalk scales with coupled line length and data rate (and inversely with rise time). Equation 1 also shows that any imbalance between $C_m/C_s$ and $L_m/L_s$ raises crosstalk. Thus, while crosstalk typically arises due to an increase in inductance, such inductance induced crosstalk can be mitigated by increasing mutual capacitance between the signal lines. More particularly, vertical transitions are inductively dominant (e.g., negative crosstalk for a rising edge excitation). Therefore, increasing $C_m/C_s$ leads to a reduction in far end crosstalk.

Past approaches to increase mutual capacitance include the implementation of a coupled via in which the metal interconnects of two adjacent signal paths include segments of metal that are brought into close proximity while maintaining their electrical isolation. In some instances, this has been accomplished by branching or extending an arm or stub of conductive material from a first metal via associated with (e.g., connected to) a first landing pad 104 to overlap a second landing pad 104 that is adjacent to or neighboring the first landing pad 104. In such instances, the conductive metal arm or stub is electrically coupled to the first landing pad 104 and electrically isolated from the second landing pad 104 (as well as an associated second metal via connected to the second landing pad 104). The conductive arm or stub is maintained in electrical isolation from the second landing pad 104 because it is fabricated in a separate metal layer within the package substrate containing the landing pads 104. Thus, a layer of dielectric material is disposed between the second landing pad 104 and the distal portion of the arm or stub that overlaps the second landing pad 104. Further, the distal portion of the arm or stub (electrically coupled to the first landing pad 104 through the first metal via connected to the first landing pad 104) is positioned and/or shaped so as to be spaced apart from the second metal via connected to the second landing pad 104. The conductive arm or stub that extends into closer proximity with the second landing pad 104 than the rest of the interconnect associated with the first landing pad 104 results in an increase in mutual capacitance.

More particularly, the amount of capacitive coupling between landing pads 104 and their associated metal interconnects created through the use of coupled via technology (e.g., the metal arm or stub discussed above) depends on three factors including (1) the dielectric constant or relative permittivity (c) of the dielectric material separating the second landing pad 104 and the overhanging arm or stub electrically connected to the first landing pad 104, (2) the amount of area (A) of the second landing pad 104 that is overlapped by the distal end of the arm or stub, and (3) the thickness (d) of the dielectric material separating the second landing pad 104 and the arm or stub. The relationship of these factors can be expressed mathematically as follows:

$$C_m = \frac{\varepsilon A}{d} \qquad (2)$$

Equation 2 shows that mutual capacitance can be increased by increasing the overlapping area (A) and/or the permittivity (c), or by reducing the dielectric thickness (d). In many IC packages, the dielectric material used between metal layers (and its associated permittivity) as well as the thickness of the dielectric material are fixed based on standard fabrication processes. Furthermore, reducing the dielectric thickness everywhere in a package can lead to insertion loss. As a result, past approaches have been focused on increasing the size of the overlapping region between the second landing pad 104 and the arm or stub. In some instances, this is accomplished by including a large area pad at the distal end of the arm or stub. However, the amount of overlap between the arm (or the distal pad at its end) and the second landing pad 104 is necessarily limited by the size of the second landing pad 104. Furthermore, relatively small landing pads 104 are desirable to lower loss and improve impedance continuity across the pads 104. Thus, there are other design considerations that limit how much the size of the overlapping region can be relied on the reduce crosstalk.

Examples disclosed herein can utilize adjustments to the size of landing pads 104 and/or distal pads on an overhanging conductive arm or stub to reduce crosstalk. However, examples disclosed herein reduce crosstalk between interconnects even further by reducing the dielectric thickness between the landing pads 104 and overhanging arms or stubs. Further, in some examples, smaller landing pads 104 can be implemented than would otherwise be possible using existing techniques because past techniques have relied on the landing pads 104 being of sufficient size to reduce crosstalk. However, teachings disclosed herein can reduce crosstalk independent of the size of the landing pads 104, thereby enabling smaller landing pads 104 to be used, which can improve loss and/or enable smaller form factors.

In some examples, standard fabrication processes using layers of dielectric material of standard thickness are still employed such that there is no significant changes to known fabrications processes. However, in some examples, the dielectric thickness is reduced by one or more extra process operations to add conductive material (e.g., metal) in a region between two immediately adjacent standard metal layers in an IC package (e.g., metal layers that are adjacent one another with no intervening metal layer therebetween and/or separated by only a single layer of dielectric laminate). More particularly, in some examples, after a standard metal layer is deposited and before the next dielectric layer is added, an isolated portion of metal is added to protrude from the standard metal layer. Thereafter, the dielectric layer is added followed by the next metal layer. Inasmuch as the isolated portion of metal protrudes from the underlying standard metal layer, there will be less distance between the isolated portion of metal and the next metal layer, which corresponds to a smaller thickness of dielectric between the layers at that location. Additionally or alternatively, in some examples, after a dielectric layer is added and before the next metal layer is added, a recessed opening is created (e.g., etched) in the dielectric layer and then filled with a conductive material. Thereafter, the standard metal layer is deposited over the dielectric layer (and the metal in the recessed opening).

Experimental testing of teachings disclosed herein on single ended DDR memory channels has shown an improvement in crosstalk by approximately 20 mV relative to other known approaches. These results were based on reducing the dielectric thickness by half relative to the standard thickness between two adjacent metal layers. Greater improvements are expected if the dielectric thickness is reduced by more than half. Furthermore, experimental testing has shown that teachings disclosed herein keep the impedance relatively similar to (and potentially better than) existing packages that do not include structures to facilitate capacitive coupling between adjacent signal paths.

Figures 2, 3, 4:
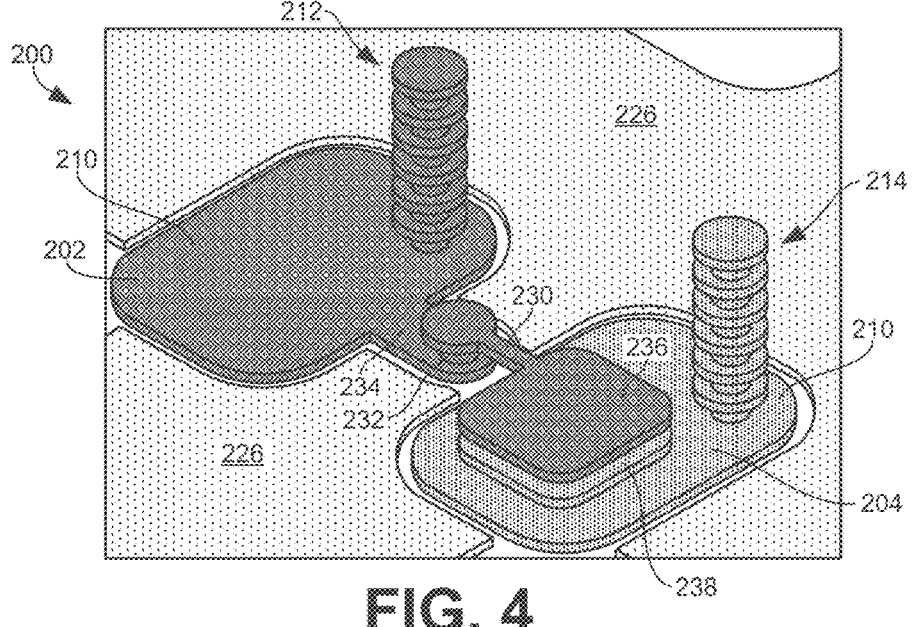
FIGS. 2-4 illustrate a portion of an example package substrate constructed in accordance with teachings disclosed here.
Figure 8:
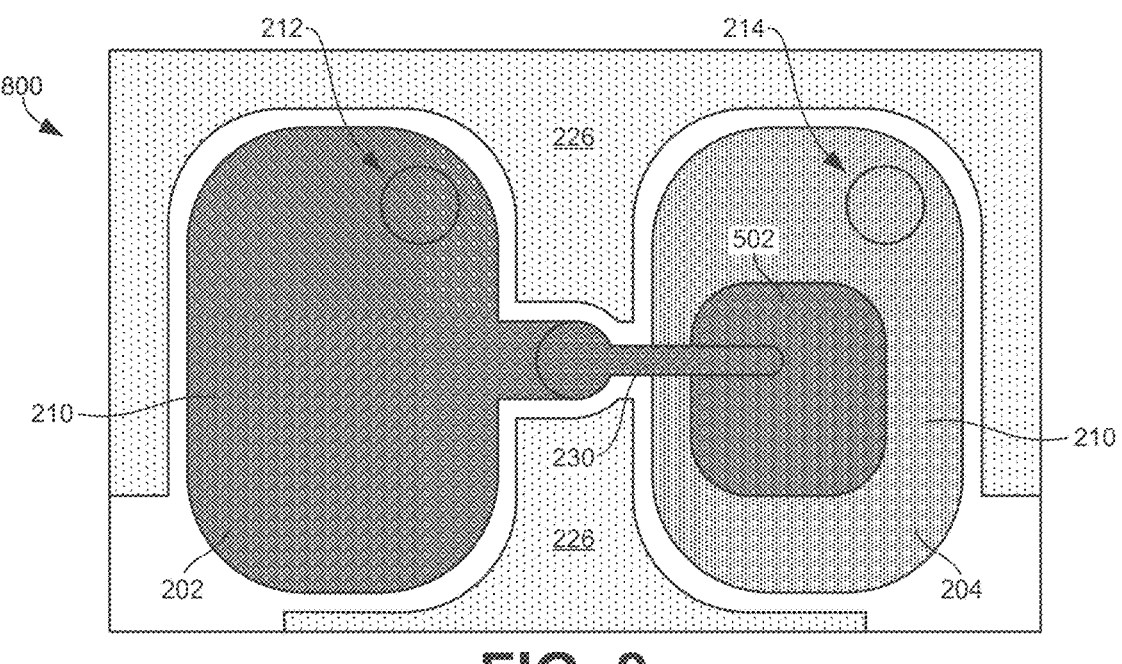
FIGS. 8-10 illustrate a portion of another example package substrate constructed in accordance with teachings disclosed here.
Figure 9:
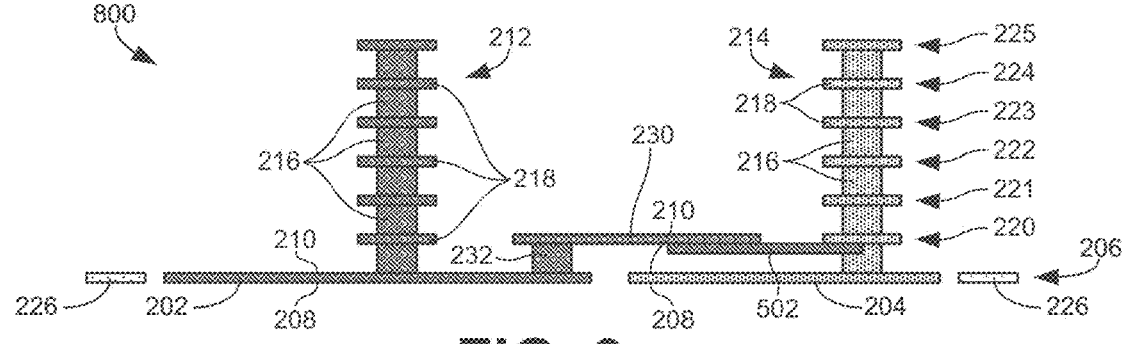
Figure 10:
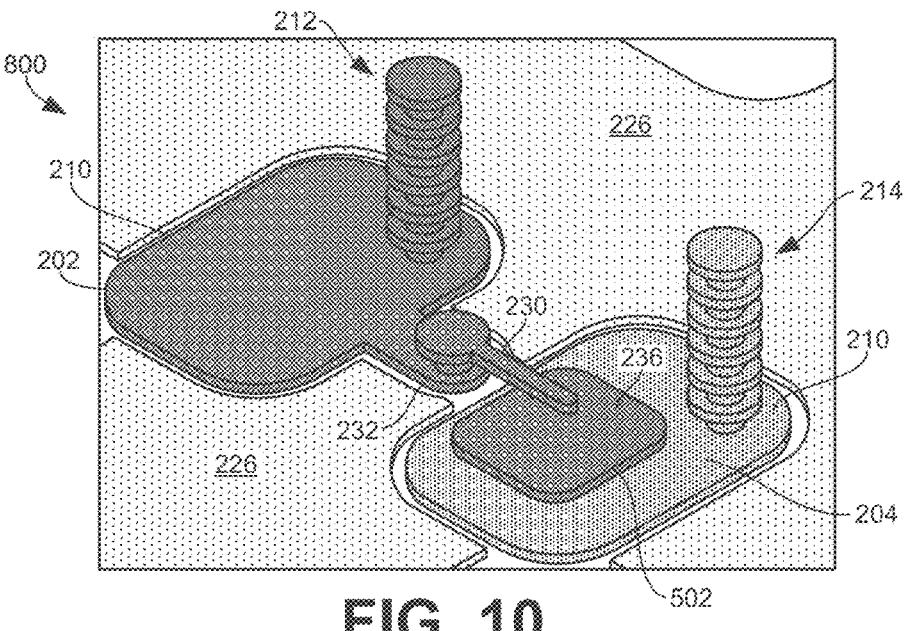

FIGS. 2-4 illustrate a portion of an example package substrate 200 with first and second landing pads 202, 204 that are capacitively coupled to one another in accordance with teachings disclosed here. More particularly, FIG. 2 is a top view of the landing pads 202, 204, FIG. 3 is a cross-sectional sideview taken along the line 3-3 in FIG. 2, and FIG. 4 is a top perspective view. In some examples, the package substrate 200 corresponds to and/or may be implemented as the package substrate 110 of FIG. 1. In other examples, the package substrate 200 of FIGS. 2-4 corresponds to an interposer disposed within an IC package and mounted on a separate underlying substrate of the package.

In FIGS. 2-4, the landing pads 202, 204 are part of a base metal layer 206 of the package substrate 200 that is adjacent an external surface of the package substrate 200 (e.g., the mounting surface 105 of the example package 100 of FIG. 1) such that an external surface 208 of the landing pads 202, 204 are exposed to the external environment of the package substrate 200 to enable the mounting of the package to another substrate (e.g., another package substrate and/or a printed circuit board (PCB) (e.g., the circuit board 102 of FIG. 1)). That is, in some examples, the landing pads 202, 204 correspond to landing pads in a land grid array (LGA). However, in other examples, the landing pads 202, 204 can be associated with any other form of metal contacts (e.g., balls in a BGA, pins in a PGA, etc.). In this example, the landing pads 202, 204 include an internal surface 210 that is opposite the external surface 210 and facing towards a core of the package substrate 200. In some examples, the internal surface 208 of the landing pads 202, 204 is covered by a dielectric material (e.g., a dielectric laminate). However, for purposes of explanation and clarity, all dielectric material of the package substrate 200 is omitted in FIGS. 2-4 to better illustrate the landing pads 202, 204 and the associated metal interconnects connected thereto. Further, for purposes of illustration and to facilitate the distinction of metal components, the first landing pad 202 and the metal components that are in electrical contact with the first landing pad 202 are shown in a first shade that is darker than a second shade used to identify the second landing pad 204 and the metal components in electrical contact with the second landing pad 204. However, the same material (e.g., copper) may be used to implement both landing pads 202, 204 and the associated conductive components (e.g., metal interconnects) connected therewith.

In this example, the first landing pad 202 is connected to a first metal via stack 212 extending away from the internal surface 210 of the first landing pad 202. Likewise, the second landing pad 202 is connected to a second metal via stack 214 extending away from the internal surface 210 of the second landing pad 204. In this example, both the first and second metal via stacks 212, 214 include metal vias 216 that extend between contact pads 218. The contact pads 218 are provided in each of six additional metal layers 220, 221, 222, 223, 224, 225 distinct from the base metal layer 206. In some examples, the base metal layer 206 and each of the other metal layers 220-225 are maintained spaced apart and electrically isolated from one another (except by way of the metal vias 216 extending therebetween) by layers of dielectric material (e.g., organic-based epoxy laminate), which has been omitted from the figures for purposes of illustration. In some examples, the metal stacks 212, 214 extend across a fewer or a greater number of metal layers than that shown in the figures. Further, in some examples, one of the metal via stacks 212, 214 may extend a different number of metal layers than the other metal via stack 212, 214.

In some examples, one or more metal traces or other portions of metal interconnects may be connected to and/or otherwise branch off the metal via stacks 212, 214 in any of one or more of the metal layers 220-225. Further, in some examples, other metal interconnect components (e.g., traces, contact pads, metal planes, etc.) may be provided within one or more of the metal layers 220-225 and/or vias may extend between different ones of the metal layers 220-225. In some such examples, these other metal interconnect components may be electrically isolated from the first and second landing pads 202, 204 and their associated metal via stacks 212, 214. However, for purposes of illustration and clarity, these other metal interconnect components have been omitted except for a metal ground plane 226 provided in the base metal layer 206. For purposes of illustration, the metal ground plane 226 is highlighted with a third shade that is lighter than either of the two shades used for the landing pads 202, 204 and the metal components connected thereto. Though represented in a different shade, in some examples, the metal ground plane 226 is made of the same material (e.g., copper) as the landing pads 202, 204 and other metal components shown in the figures. As shown in the illustrated example, although in the same metal layer (e.g., the base metal layer 206) as the landing pads 202, 204, the ground plane 226 is electrically isolated from the landing pads 202, 204 by metal voiding regions or spaces 228 surrounding the landing pads 202, 204. In some examples, the metal voiding regions 228 are filled with dielectric material (which, as noted above, has been omitted from the figures for purposes of illustration).

As shown in the illustrated example of FIGS. 2-4, the first landing pad 202 is electrically coupled to a conductive (metal) arm 230 provided in the metal layer 220 directly adjacent the base layer 206. The metal layer 220 immediately adjacent the base layer 206 is sometimes referred to as the base-1 metal layer, with the next adjacent layer 222 referred to as the base-2 metal layer and so on for each additional metal layer (e.g., the uppermost metal layer 225 in FIG. 3 would be the base-6 metal layer). As shown in the illustrated example, the arm 230 extends laterally away from the first landing pad 202 and extends so as to overlap or overhang the second landing pad 204. However, the arm 230 (which is electrically connected to the first landing pad 202) remains electrically isolated from the second landing pad 204 because the arm 230 and the second landing pad 204 are provided in different metal layers (e.g., the base metal layer 206 and the base-1 metal layer 220) and separated by a layer of dielectric material positioned therebetween. In this example, the arm 230 is electrically coupled to the first landing pad 204 by a metal via 232 extending between the arm 230 and a lateral protrusion 234 of the main portion of the first landing pad 202. In other examples, the lateral protrusion 234 is omitted and the metal via 232 is directly connected to the main body of the first landing pad 204.

In some examples, the arm 230 includes a distal pad or plate 236 at the distal end of the arm 230 (e.g., at the end farthest away from the first landing pad 202). In this example, the distal pad 236 has a relatively large surface area that is aligned with the second landing pad 204. That is, the distal pad 236 overlaps the second landing pad 204 in a direction normal to the internal surface 210 of the second landing pad 204. The area of the distal pad 236 that overhangs and faces the second landing pad 204 impacts the amount of mutual capacitance between the first landing pad 202 and the second landing pad 204, which, in turn, reduces crosstalk between the two signal paths. That is, as the size of the distal pad 236 increases, the mutual capacitance also increases, thereby reducing crosstalk. However, the amount of increase to the mutual capacitance (and the resulting decrease to crosstalk) is limited by the size of the second landing pad 204 because no significant gains in mutual capacitance are achieved by a distal pad 236 that is larger than or extends beyond the outer perimeter of the second landing pad 204. Furthermore, there are other design considerations (overall package footprint, concerns for insertion loss and/or impedance discontinuities) that limit the size of the landing pads 202, 204 with reasons to make them smaller and smaller as technology continues to advance. Accordingly, relying on relatively large surface areas of the second landing pad 204 and the distal pad 236 facing one another may not be sufficient to increase mutual capacitance so as to adequately reduce crosstalk. Accordingly, in examples disclosed herein, the thickness of the dielectric material between the second landing pad 204 and the distal pad 236 on the arm 230 connected to the first landing pad 202 is reduced.

In the illustrated example, the thickness of the dielectric material between the second landing pad 204 and the distal pad 236 is reduced by the inclusion of a layer of conductive material (e.g., metal) between the base metal layer 206 (in which the landing pads 202, 204 are provided) and the base-1 metal layer 220 (in which the arm 230 and distal pad 236 are provided). More particularly, as shown in FIGS. 3 and 4, the second landing pad 204 includes a conductive (e.g., metal) protrusion, pad, or plate 238 that extends from the internal surface 210 of the second landing pad 204 towards the distal pad 236. As a result, a reduced gap, spacing, or distance 240 between the protrusion 238 and the arm 230 (and corresponding distal pad 236) is less than a baseline gap, spacing, or distance 242 between adjacent ones of the metal layers 206, 220-225. In this example, the reduced gap 240 is to be filled with a dielectric material and, therefore, corresponds to the thickness of the dielectric material between the second landing pad 204 and the distal pad 236. In the illustrated example, the reduced gap 240 is more than half the baseline gap 242. However, in other examples, the reduced gap 240 is approximately half (e.g., within 5% of exactly half) the baseline gap 242. In other examples, the reduced gap 240 is less than half the baseline gap 242.

The particular thickness of the reduced gap 240 (and corresponding dielectric thickness at that region) can be controlled to any suitable thickness by adjusting the thickness of the protrusion 238. That is, whereas the thickness of the metal layers 206, 220-225 as well as the baseline gap 242 between such distances is typically maintained at relatively consistent measurements based on the fabrication processes involved when manufacturing the example package substrate, the thickness of the protrusion 238 is not tied to these standard fabrication processes. Therefore, the thickness of the protrusion 238 can be tuned or controlled to any thickness, thereby enabling the reduced gap 240 to be controlled, which in turn enables the impact on mutual capacitance (and, by extension, crosstalk) to also be controlled. Thus, while the protrusion 238 is shown as having the same thickness as the metal layers 206, 220-225, in other examples, the protrusion 238 can be thicker than or thinner than the metal layers 206, 220-225. In other words, the protrusion 238 can extend any suitable portion (e.g., at least 5%, at least 10%, at least 15%, at least 25%, at least 35%, at least 50%, at least 75%, at least 90%, etc.) of the distance between the two adjacent metal layers between which the protrusion 238 is located. In some examples, the protrusion 238 is a separate layer of metal that is added in a separate fabrication process to the metal in the metal layer to which the protrusion 238 is attached (e.g., the base metal layer 206 in FIG. 2). In other examples, the protrusion 238 is an integral extension of the metal in the metal layer to which the protrusion 238 is attached. As shown in the illustrated example, the protrusion 238 is oriented to extend substantially parallel to the metal layers 206, 220-225. As used herein, substantially parallel means exactly parallel or within 5 degrees of exactly parallel.

As shown most clearly in FIG. 4, in this example, the protrusion 238 has a shape that corresponds to (e.g., matches) and is aligned with (in a direction normal to the internal surface 210 of the second landing pad 204) the distal pad 236 of the arm 230. However, in other examples, the distal pad 236 can be larger than the protrusion 238. In other examples, the protrusion 238 is larger than the distal pad 236. Further, in some examples, the distal pad 236 and the protrusion 238 have different shapes.

FIGS. 5-7 illustrate a portion of another example package substrate 500 that is substantially the same in design and construction as the example package substrate 200 of FIGS. 2-4 except as noted below. As such, the reference numerals used in FIG. 2-4 are used for the same or similar components in FIGS. 5-7. Further, the description of the components provided above in connection with FIGS. 2-4 applying equally to the corresponding components in FIGS. 5-7. In some examples, the package substrate 500 corresponds to and/or may be implemented as the package substrate 110 of FIG. 1. In other examples, the package substrate 500 of FIGS. 5-7 corresponds to an interposer disposed within an IC package and mounted on a separate underlying substrate of the IC package.

In the illustrated example of FIGS. 5-7, the second landing pad 204 does not include the protrusion 238 shown in FIGS. 2-4. Rather, the dielectric thickness between the second landing pad 204 (in the base metal layer 206) and the distal pad 236 of the arm 230 (in the base-1 metal layer 220)

in FIGS. 5-7 is reduced by a protrusion, pad, or plate 502 extending from the distal pad 236 toward the second landing pad 204. That is, the protrusion 502 shown in FIGS. 5-7 is an extension of and/or electrically connected to the arm 230 that is connected to the first landing pad 202. By contrast, the protrusion 238 shown in FIGS. 2-4 is an extension of and/or electrically connected to the second landing pad 204. The inclusion of the protrusion 502 of FIGS. 5-7 results in a reduced gap, spacing, or distance 504 that is comparable to the gap 240 shown and described above in connection with FIGS. 2-4. In some examples, both the protrusion 238 extending from the second landing pad 204 and the protrusion 502 extending from the distal pad 236 are positioned between the base metal layer 206 and the base-1 metal layer 220 (similar to what is shown in the illustrated example of FIG. 12 described in further detail below). In such examples, the dielectric thickness corresponds to the baseline distance 242 between the metal layers less the thickness of both protrusions 238, 502.

In FIGS. 5-7, the protrusion 502 is dimensioned and shaped similarly to the distal pad 236 provided within the base-1 metal layer 220. However, in some examples, the protrusion 502 can be a different size and/or shape than the size and shape of the distal pad 236. Further, in some examples, the distal pad 236 is omitted as shown in the example package substrate 800 of FIGS. 8-10. Specifically, in the illustrated example of FIGS. 8-10, the protrusion 502 extends from a surface of a narrow elongate portion of the arm 230.

Figure 11:
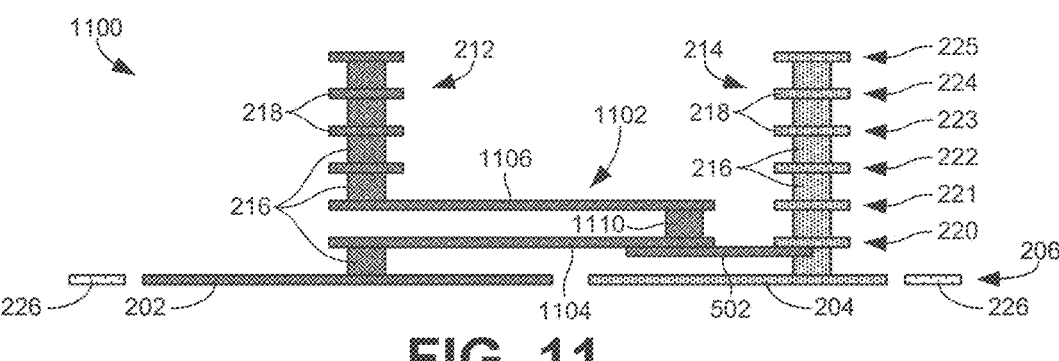
FIG. 11 illustrate a portion of another example package substrate constructed in accordance with teachings disclosed here.

In each of the example package substrates 200, 500, 800 of FIGS. 2-10, the arm 230 is a stub or branch off of the signal path for the first landing pad 202, which is directed through the first metal via stack 212 that is spaced apart from the arm 230 (independently connected to the first landing pad by the separate metal via 232). However, in other examples, the arm 230 directly branches off the metal via stack 212 such that the separate metal via 232 is omitted. In other examples, the arm 230 can be placed in series with the metal via stack 212 such that the arm 230 defines a portion of the signal path for the first landing pad 202. One example construction to achieve this result is shown in the example package substrate 1100 shown in FIG. 11. In particular, as shown in FIG. 11, instead of implementing an arm 230 as a stub, the example package 1100 includes a loop 1102 with two arm segments 1104, 1106 provided in separate metal layers (e.g., the base-1 layer 220 and the base-2 layer 221) of the substrate 1100. In this example, first ends of both arms 1104, 1106 are connected to different ones of the vias 216 in the metal via stack 212. Further, the first ends of the two arms 1104, 1106 are separated from one another by a layer of dielectric material. However, the arms 1104, 1106 are still electrically coupled at their second (distal) ends by a separate metal via 1110. In this manner, the arms 1104, 1106 (along with the interconnecting metal via 1110) define a loop along which a signal must path between the first landing pad 202 and the far end of the metal via stack 212. Further, in this example, a protrusion 1112 (similar to the protrusion 502 of FIGS. 5-7 or FIGS. 8-10) is connected to the distal end of the first arm 1104 so as to be between the second landing pad 204 (in the base metal layer 206) and the arm 1104 (in the base-1 metal layer 220).

Other arrangements of the metal components than what is shown in FIG. 11 is possible to provide a loop 1102 that defines a portion of the signal path for the first landing pad 202 that extends over the second landing pad 204. For instance, in some examples, both of the arms 1104, 1106 are provided in the same metal layer (e.g., the base-1 metal layer 220) but laterally offset to one another (e.g., at different points into and out of the drawing as shown in FIG. 11). To complete the signal path, in such examples, the separate metal via 1110 is positioned near the first end of the second arm 1106 (proximate the metal via stack 212) to extend up to the base-2 metal layer 221 and then a relatively short metal trace in the base-2 metal layer 221 connects the separate metal via 1110 with the metal via 216 between the base-2 metal layer 221 and the base-3 metal layer 222. In other examples, some or all of the metal vias 216 and the associated contact pads 218 are positioned in alignment with the separate via 1110 (which is in alignment with the second landing pad 204). Further, in some examples, the protrusion 238 on the second landing pad 204 in FIGS. 2-4 can be included in the illustrated example of FIG. 11 in addition to or instead of the protrusion 502.

Figure 12:
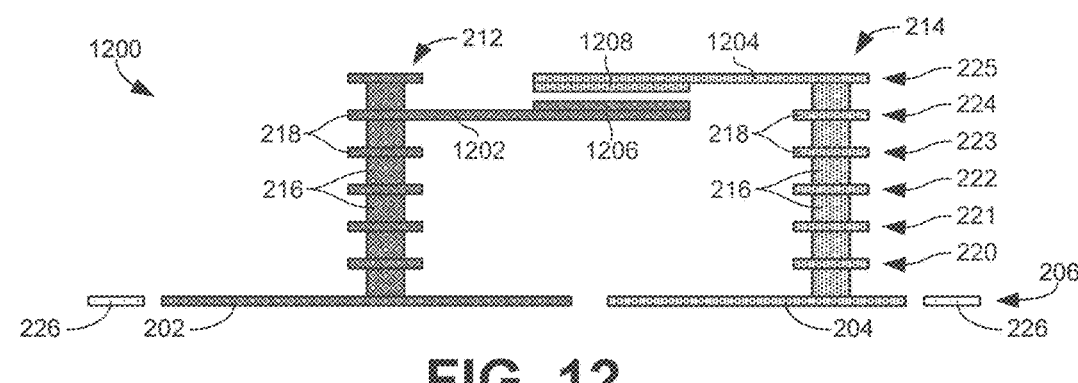
FIG. 12 illustrate a portion of another example package substrate constructed in accordance with teachings disclosed here.

FIG. 12 is a cross-sectional view of a portion of another example package substrate 1200 constructed in accordance with teachings disclosed herein. In this example, mutual capacitance is increased by adding metal between facing surfaces of metal pads that are in metal layers other than the base metal layer and the base-1 metal layer. More particularly, in the illustrated example, a first arm 1202 in the base-5 metal layer 224 is connected to and extends away from the first metal via stack 212 and a second arm 1204 in the base-6 metal layer 225 is connected to and extends away from the second metal via stack 214. As shown in the illustrated example, the two arms 1202, 1204 extend towards each other such that their distal ends overlap. In this example, the first arm 1202 is coupled to a first distal pad, plate, or protrusion 1206 provided in the gap between the two arms 1202, 1204. Likewise, in this example, the second arm 1204 is coupled to a second distal pad, plate, or protrusion 1208 provided in the gap between the two arms 1202, 1204. Inasmuch as the distal pads 1206, 1208 extend towards one another from the facing surfaces of the corresponding arms 1202, 1204, the distance between the distal pads 1206, 1208 is less than the nominal distance between the metal layers 224, 225 along which the arms 1202, 1204 extend. In some examples, only one of the distal pads 1206, 1208 is included between the arms 1202, 1204.

Although the arms 1202, 1204 of FIG. 12 are shown in the base-5 and base-6 metal layers 224, 225, the arms 1202, 1204 can be implemented in any of the metal layers 220-225. Further, in some examples, one or both of the metal stacks 212, 214 is connected to multiple different arms provided in different metal layers 220-225 to provide multiple points of capacitively coupling between the two signal paths. For instance, in some examples, the arms 1202, 1204 shown and described in FIG. 12 can be used in combination with the arm 230 shown in the examples of FIGS. 2-10 and/or in combination with the loop 1102 shown in the example of FIG. 11.

Figure 13:
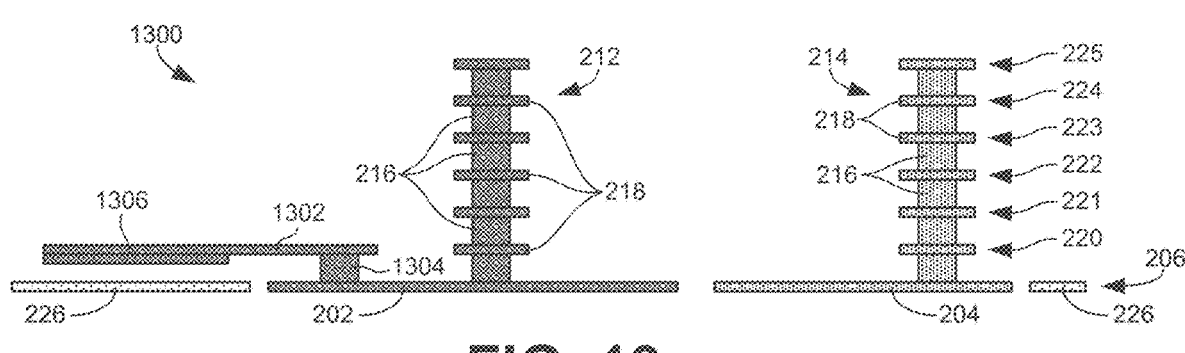
FIG. 13 illustrate a portion of another example package substrate constructed in accordance with teachings disclosed here.

FIG. 13 is a cross-sectional view of a portion of another example package substrate 1300 constructed in accordance with teachings disclosed herein. In this example, rather than capacitively coupling the two signal paths associated with the first and second landing pads 202, 204, the first signal path associated with the first landing pad 202 is capacitively coupled with the ground plane 226. More particularly, as shown in the illustrated example, an arm 1302 provided in the base-1 metal layer 206 is electrically coupled to the first landing pad 202 (by a metal via 1304) and extends away from the landing pad 202 to overhang or overlap the ground plane 226. Further, in this example, a distal pad, plate, or protrusion 1306 extends from the arm 1302 towards the ground plane 226, thereby providing metal between the adjacent metal layers 206, 220 to reduce the thickness of the dielectric material disposed therebetween. In some examples, a protrusion extending from the ground plane 226 towards the arm 1302 can be included in the illustrated example of FIG. 13 in addition to or instead of the protrusion 1306. In some examples, a separate arm can branch off the metal via stack 212 at another metal layer to capacitively couple with ground planes in any other metal layer 220-225 within the package 1300. Further, in some examples, the arm 1302 (and/or a similar arm in a separate metal layer) can be used in combination with any of the arms 230, 1104, 1106, 1202, 1204 and associated pads, plates, or protrusions 236, 238, 502, 1206, 1208 shown and described above in connection with FIGS. 2-12.

The foregoing examples of the package substrates 200, 500, 800, 1100, 1200, 1300 of FIGS. 2-13 teach or suggest different features. Although each of the example package substrates 200, 500, 800, 1100, 1200, 1300 disclosed above have certain features, it should be understood that it is not necessary for a particular feature of one example to be used exclusively with that example. Instead, any of the features described above and/or depicted in the drawings can be combined with any of the examples, in addition to or in substitution for any of the other features of those examples. One example's features are not mutually exclusive to another example's features. Instead, the scope of this disclosure encompasses any combination of any of the features.

Different fabrication processes can be used to add the metal pads, plates, or protrusions 238, 502, 1206, 1208, 1306 disposed between the standard metal layers 206, 220-225 in the example package substrates 200, 500, 800, 1100, 1200, 1300 of FIGS. 1-13. More particularly, in some examples, the fabrication processes employed can depend on whether the metal pads, plates, or protrusions 238, 502, 1206, 1208, 1306 are connected to and extending from a surface of a particular metal layer 206, 220-225 that is facing away from or towards a bottom surface of the corresponding substrate (e.g., facing away from or towards the bottom surface 105 in the example package substrate 110 of FIG. 1). In particular, in the foregoing illustrated examples, the pads, plates, or protrusions 238, 1206 in FIGS. 2-5 and 12 are connected to and extend from surfaces of metal layers 206, 224 that face away from the bottom surface of the corresponding substrates 200, 1200. That is, the pads, plates, or protrusions 238, 1206 are closer to the bottom surface of the package substrates than the metal layers 206, 224 to which the pads, plates, or protrusions 238, 1206 are connected. By contrast, the pads, plates, or protrusions 502, 1208, 1306 in FIGS. 6-13 are connected to and extend from surfaces of metal layers 220, 225 that face towards the bottom surface of the corresponding substrates 500, 800, 1100, 1200, 1300. That is, the pads, plates, or protrusions 502, 1206, 1208, 1306 are farther away from the bottom surface of the package substrates than the metal layers 220, 225 to which the pads, plates, or protrusions 502, 1206, 1208, 1306 are connected.

In some examples, the particular side of a metal layer to which a metal pad or protrusion is connected is based on the fabrication processes (e.g., semi-additive process (SAP) or substractive etch process) used to manufacture other components or parts in the corresponding package substrates 200, 500, 800, 1100, 1200, 1300. SAPs involve additive process operations in which metal (e.g., copper) is added to an underlying dielectric layer to create a pattern. By contrast, subtractive etch processes begin with laminate of prepreg and copper that is patterned and etched to remove unwanted copper. The particular type of fabrication processes used manufacture the example package substrates disclosed herein can depend on the nature of the substrate. For instance, many packages and/or patches produced today are manufactured using SAP for finer line/space. By contrast, many interposers and/or PCBs produced today are manufactured using substrate etch processes. Examples disclosed herein can be implemented using SAP and/or subtractive etch process with only minor modifications in the process flow.

FIGS. 14-17 illustrate example stages in the fabrication process of the example package substrate 200 of FIGS. 2-4 to add the protrusion 238 at a location connected to the base metal layer 206 on the side of the base metal layer 206 facing towards the base-1 metal layer 220. The example fabrication process represented by FIGS. 14-17 can be suitable adapted to add metal at any location in a package substrate on a side of a particular metal layer facing away from the bottom surface of the substrate. Thus, the description of FIGS. 14-17 equally applies to enable the fabrication of the pad, plate, or protrusion 1206 in FIG. 12.

Figures 14, 15, 16, 17:
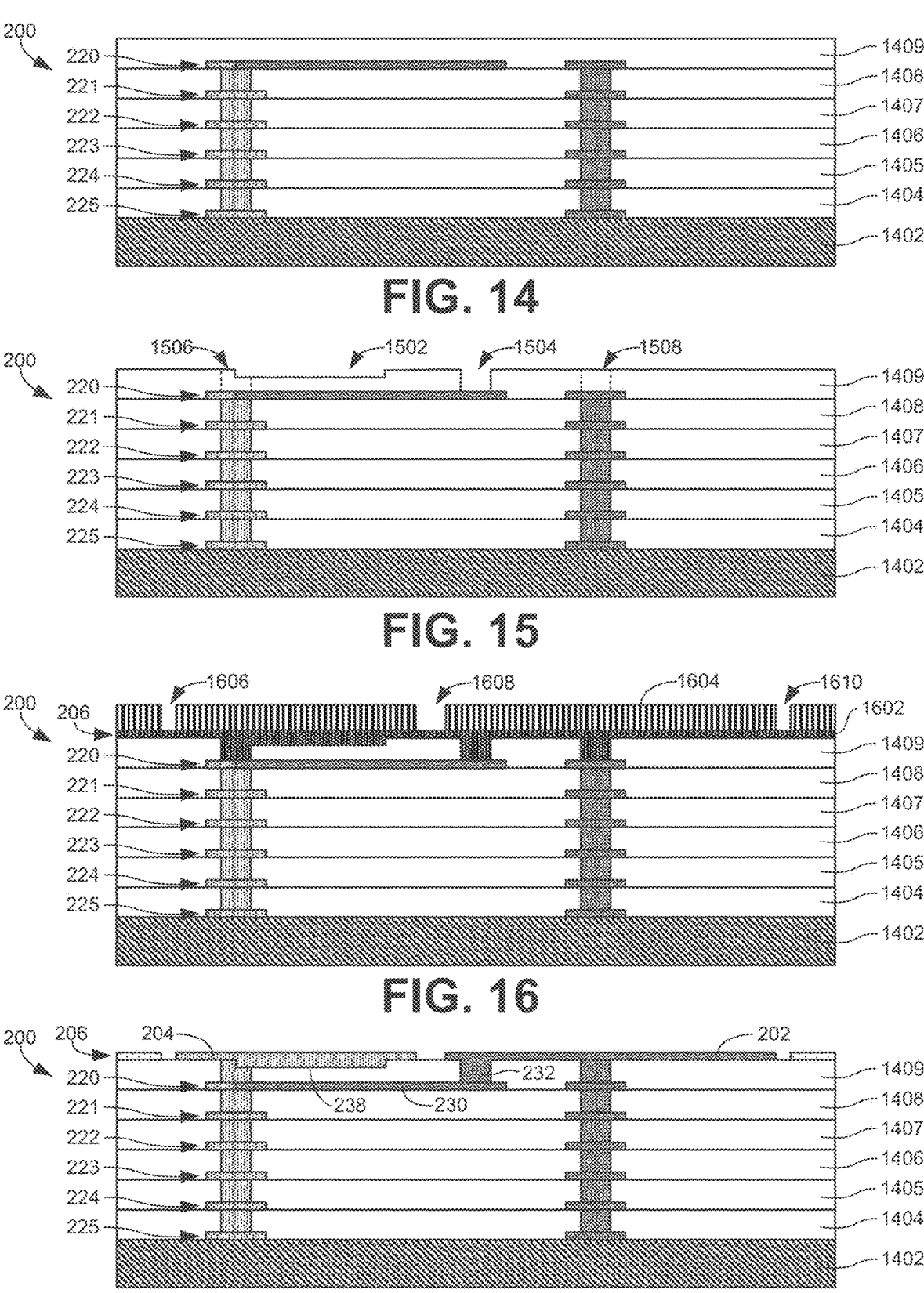
FIGS. 14-17 illustrate stages in an example fabrication process to manufacture the example package substrate of FIGS. 2-4.

For purposes of explanation, the package substrate 200 represented in FIGS. 14-17 has been inverted or flipped over relative to how the substrate 200 is shown in FIGS. 2-4 because the base metal layer 206 (containing the landing pads 202, 204 and ground plane 226) is the last layer of metal added. In other words, during fabrication, package substrates are built outward from a package core 1402 represented in FIGS. 14-17. Thus, as shown in the illustrated example, the base-6 metal layer 225 is adjacent the package core 1402, with a first dielectric layer 1404 added thereto. The stage of fabrication represented in FIG. 14 includes subsequent metal layers and intervening dielectric layers 1405, 1406, 1407, 1408 up to the base-1 metal layer 220 having already been added to the package core 1402 using any suitable (e.g., standard) fabrication processes. As shown in FIG. 14, the base-1 metal layer 220 includes a metal region corresponding to the arm 230 and associated distal pad 236 shown in FIGS. 2-4. Further, at the stage represented in FIG. 14, a final dielectric layer 1409 has been added over the base-1 metal layer 220 and the underlying dielectric layer 1408.

FIG. 15 represents the stage of fabrication after openings 1502, 1504, 1506, 1508 have been created in the exposed dielectric layer 1409 to define regions to be filled by metal to provide the metal structures associated with final design for the package substrate 200. In some examples, the openings 1502, 1504, 1506, 1508 are provided through an etching process (e.g., following placement and patterning of a mask) or other subtractive process (e.g., laser drilling). In this example, the first opening 1502 defines the region where the protrusion 238 that extends from the second landing pad 204 is to be added. The second opening 1504 defines the region where the metal via 232 connecting the first landing pad 202 to the arm 230 is to be added. For purposes of clarity and illustration, the last two openings 1506, 1508 are demarcated by dashed lines to represent that the openings 1506, 1508 are not in the same cross-sectional plane as the first two openings 1502, 1504 but are farther into the drawing. More particularly, the last two openings 1506, 1508 correspond to the metal vias 216 in the metal via stacks 212, 214 of the example package substrate 200.

FIG. 16 represents the stage of fabrication after openings 1502, 1504, 1506, 1508 have been filled with metal (e.g., copper) 1602 as well the metal extending across the entire exposed surface of the uppermost dielectric layer 1409. The metal extending across the surface of the dielectric layer 1409 corresponds to the base metal layer 206 of FIGS. 2-4.

In some examples, the metal 1602 is added through an electrolytic plating process. In some examples, the metal 1602 is added through an electroless plating process. At the stage represented in FIG. 16, the metal 1602 is connected across the entire surface of the package substrate assembly and, therefore, does not yet correspond to the isolated landing pads 202, 204 (with the associated protrusion 238), vias 216, 232, and ground plane 226. However, FIG. 16 further shows a dry film resist 1604 added to the metal 1602 and patterned with openings 1606, 1608, 1610. The openings 1606, 1608, 1610 expose regions of the metal 1602 to be removed or etched away to divide the metal 1602 into the final isolated regions associated with the package substrate design for the base metal layer 206.

FIG. 17 represents the stage of fabrication after the metal 1602 of FIG. 16 has been etched and divided into different isolated regions. For purposes of illustration, the shading of the different regions have been changed in FIG. 17 (relative to the shading used in FIG. 16) to match the corresponding metal components to which each region is connected in the final design as previously explained above in connection with FIGS. 2-4. Further, FIG. 17 represents the package substrate 200 after the removal (e.g., stripping) of the dry film resist 1604. Thus, FIG. 17 represents the final design as shown in FIG. 2 with the protrusion 238 connected to the second landing pad 204 in a manner that extends toward the arm 230 in the base-1 metal layer 220 that is connected to the first landing pad 202 by the metal via 232. Although the basic design or structure of metal components is complete at the stage of fabrication represented in FIG. 17, in some examples, the package substrate 200 may undergoing additional process operations before final completion.

FIGS. 18-21 illustrate example stages in the fabrication process of the example package substrate 500 of FIGS. 5-7 to add the protrusion 502 at a location connected to the base-1 metal layer 220 on the side of the base-1 metal layer facing towards the landing pads 202, 204. The example fabrication process represented by FIGS. 18-21 can be suitable adapted to add metal at any location in a package substrate on a side of a particular metal layer facing toward the bottom surface of the substrate. Thus, the description of FIGS. 18-21 equally applies to enable the fabrication of the pads, plates, or protrusions 502, 1208, 1306 in FIGS. 8-13.

Figure 18:
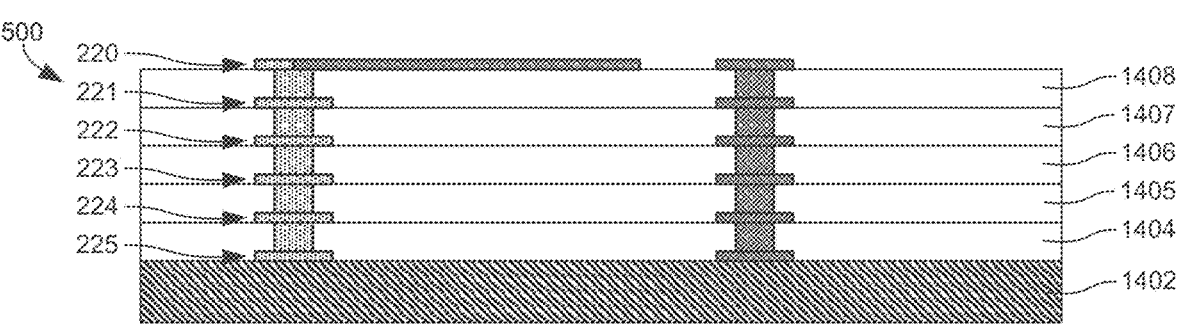
FIGS. 18-21 illustrate stages in an example fabrication process to manufacture the example package substrate of FIGS. 5-7.

As with the illustrated examples in FIGS. 14-17, the package substrate 500 represented in FIGS. 18-21 has been inverted or flipped over relative to how the substrate 200 is shown in FIGS. 5-7 for purposes of explanation. FIG. 18 represents the stage of fabrication that is substantially the same as represented in FIG. 14 such that the same reference numerals will be used for the same parts. More particularly, FIG. 18 is identical to FIG. 14 except that the uppermost dielectric layer 1409 shown in FIG. 14 has not yet been added in FIG. 18.

Figure 19:
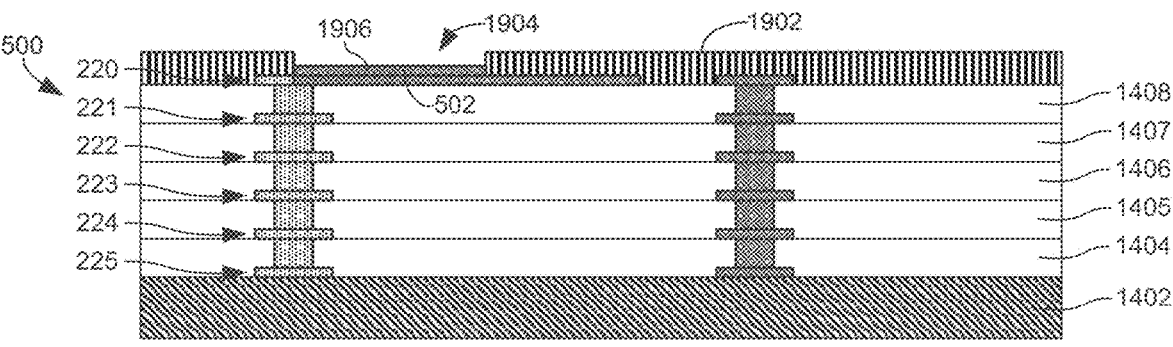

FIG. 19 represents the addition of a dry film resist 1902 that has been patterned with an opening 1904 corresponding to the region where the protrusion 502 is to be added. Further, FIG. 19 represents metal 1906 (corresponding to the protrusion 502) having been added within the opening 1904. In some examples, the metal 1906 is added through an electrolytic plating process. In some examples, the metal 1906 is added through an electroless plating process.

Figure 20:
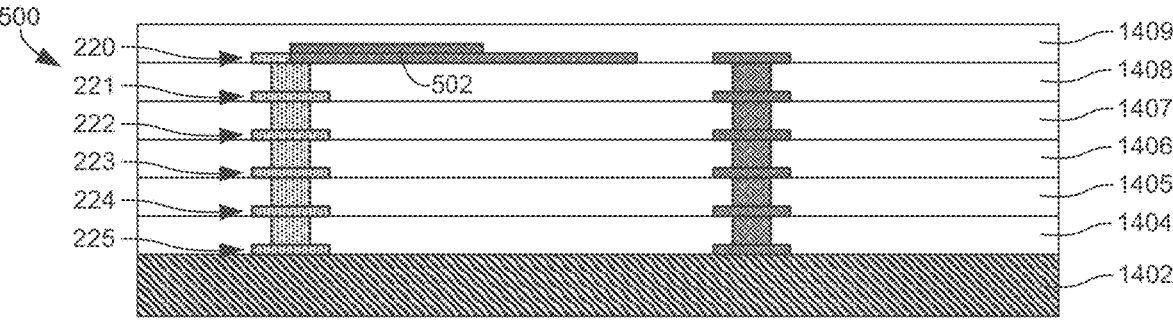

FIG. 20 represents the stage of fabrication after the dry film resist 1902 has been removed (e.g., via stripping) and the final dielectric layer 1409 has been added over the protrusion 502, the underlying metal components in the base-1 metal layer 220, and the underlying dielectric layer 1408. In some examples, the protrusion 502 may cause the dielectric layer 1409 to be uneven (e.g., have a bump) at the location of the protrusion 502. Accordingly, in some examples, a planarization process is implemented to flatten out the dielectric layer to remove excess dielectric material in the region of the protrusion 502. As a result, the dielectric layer 1409 will be thinner in the region of the protrusion 502 than elsewhere.

Figure 21:
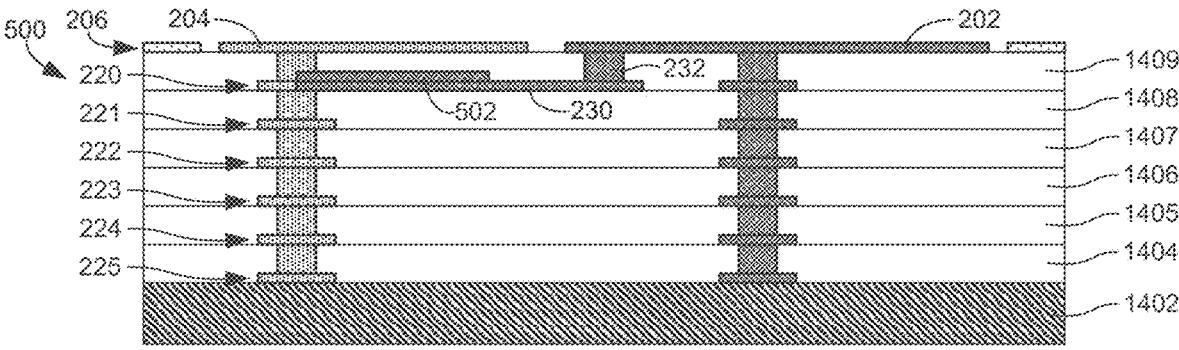

FIG. 21 represents the stage of fabrication after the creation of the vias 216 in the metal via stacks 212, 214, after the creation of the landing pads 202, 204 and ground plane 226 in the base metal layer 206, and after the creation of the via 232 that connects the arm 230 (to which the protrusion 502 is connected) to the first landing pad 202. The creation of these components can be accomplished using any suitable (e.g., standard) fabrication processes.

The example package substrates 200, 500, 800, 1100, 1200, 1300 of FIGS. 2-13 and, more generally, the example IC package 100 of FIG. 1 disclosed herein may be included in any suitable electronic component. FIGS. 22-25 illustrate various examples of apparatus that may include or be included in the IC package 100 disclosed herein.

Figure 22:
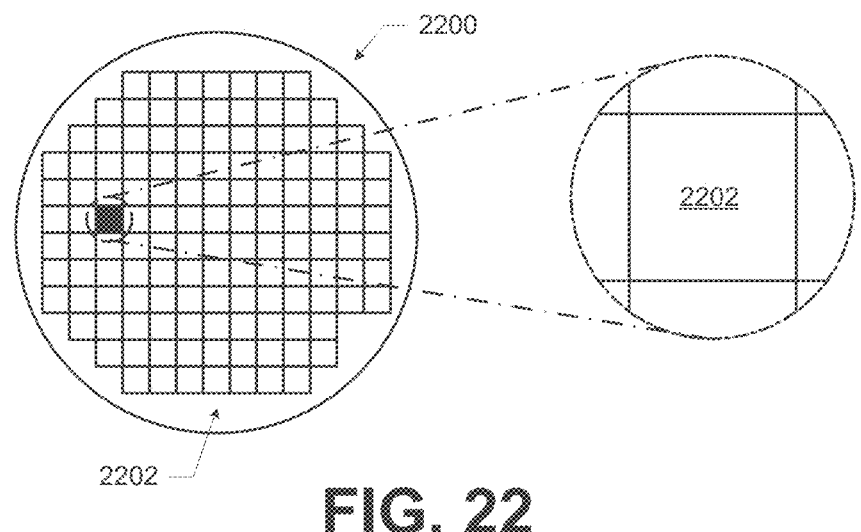
FIG. 22 is a top view of a wafer and dies that may be included in an IC package constructed in accordance with teachings disclosed herein.

FIG. 22 is a top view of a wafer 2200 and dies 2202 that may be included in the IC package 100 of FIG. 1 (e.g., as any suitable ones of the dies 106, 108). The wafer 2200 may be composed of semiconductor material and may include one or more dies 2202 having IC structures formed on a surface of the wafer 2200. Each of the dies 2202 may be a repeating unit of a semiconductor product that includes any suitable IC. After the fabrication of the semiconductor product is complete, the wafer 2200 may undergo a singulation process in which the dies 2202 are separated from one another to provide discrete "chips" of the semiconductor product. The die 2202 may include one or more transistors (e.g., some of the transistors 2340 of FIG. 23, discussed below), supporting circuitry to route electrical signals to the transistors, passive components (e.g., signal traces, resistors, capacitors, or inductors), and/or any other IC components. In some examples, the wafer 2200 or the die 2202 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 2202. For example, a memory array formed by multiple memory devices may be formed on a same die 2202 as processor circuitry (e.g., the processor circuitry 2502 of FIG. 25) or other logic that is configured to store information in the memory devices or execute instructions stored in the memory array. The example IC package 100 disclosed herein may be manufactured using a die-to-wafer assembly technique in which some dies 106, 108 are attached to a wafer 2200 that include others of the dies 106, 108, and the wafer 2200 is subsequently singulated.

Figure 23:
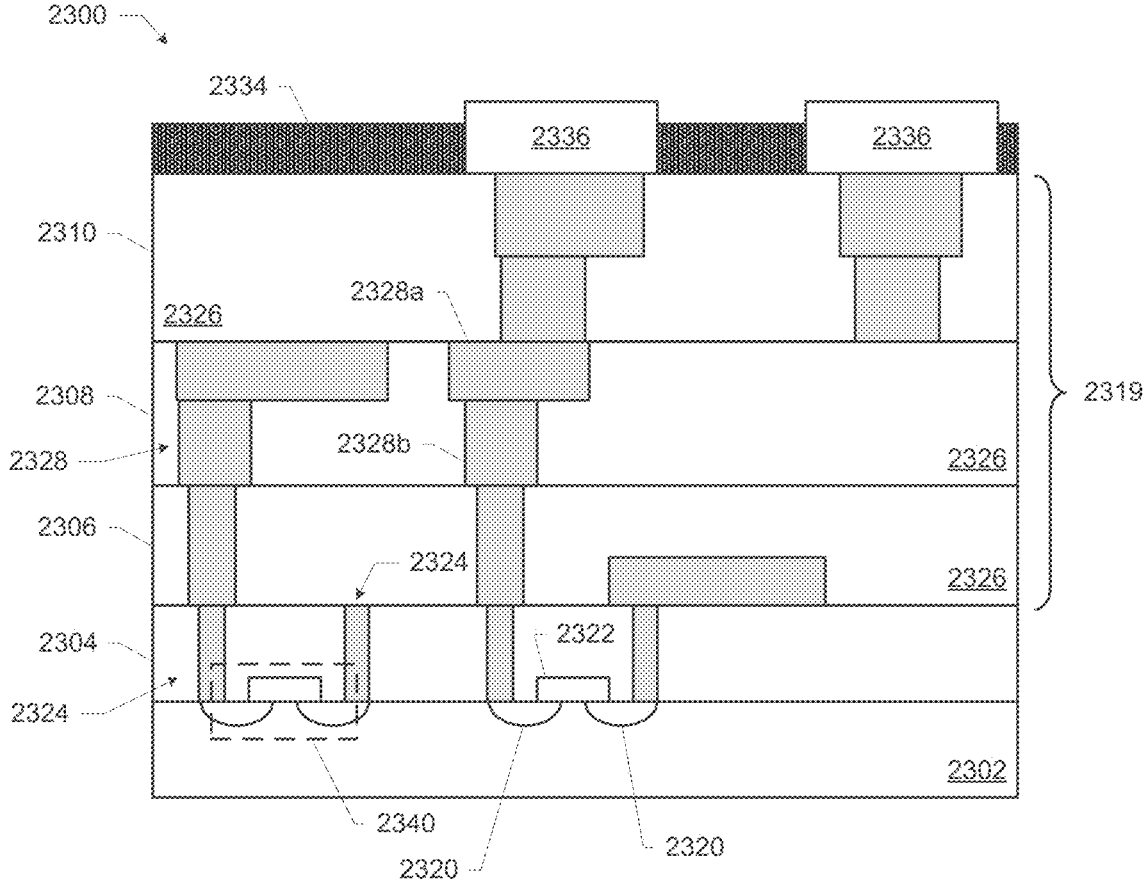
FIG. 23 is a cross-sectional side view of an IC device that may be included in an IC package constructed in accordance with teachings disclosed herein.

FIG. 23 is a cross-sectional side view of an IC device 2300 that may be included in the example IC package 100 (e.g., in any one of the dies 106, 108). One or more of the IC devices 2300 may be included in one or more dies 2202 (FIG. 22). The IC device 2300 may be formed on a die substrate 2302 (e.g., the wafer 2200 of FIG. 22) and may be included in a die (e.g., the die 2202 of FIG. 22). The die substrate 2302 may be a semiconductor substrate composed of semiconductor material systems including, for example, n-type or p-type materials systems (or a combination of both). The die substrate 2302 may include, for example, a crystalline substrate formed using a bulk silicon or a siliconon-insulator (SOI) substructure. In some examples, the die substrate 2302 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the die substrate 2302. Although a few examples of materials from which the die substrate 2302 may be formed are described here, any material that may serve as a foundation for an IC device 2300 may be used. The die substrate 2302 may be part of a singulated die (e.g., the dies 2202 of FIG. 22) or a wafer (e.g., the wafer 2200 of FIG. 22).

The IC device 2300 may include one or more device layers 2304 disposed on the die substrate 2302. The device layer 2304 may include features of one or more transistors 2340 (e.g., metal oxide semiconductor field-effect transistors (MOSFETs)) formed on the die substrate 2302. The device layer 2304 may include, for example, one or more source and/or drain (S/D) regions 2320, a gate 2322 to control current flow in the transistors 2340 between the S/D regions 2320, and one or more S/D contacts 2324 to route electrical signals to/from the S/D regions 2320. The transistors 2340 may include additional features not depicted for the sake of clarity, such as device isolation regions, gate contacts, and the like. The transistors 2340 are not limited to the type and configuration depicted in FIG. 23 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 2340 may include a gate 2322 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some examples, an annealing process may be carried out on the gate dielectric to improve its quality when a high-k material is used.

The gate electrode may be formed on the gate dielectric and may include at least one p-type work function metal or n-type work function metal, depending on whether the transistor 2340 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some examples, when viewed as a cross-section of the transistor 2340 along the source-channel-drain direction, the gate electrode may consist of a U-shaped structure that includes a bottom portion substantially parallel to the surface of the die substrate 2302 and two sidewall portions that are substantially perpendicular to the top surface of the die substrate 2302. In other examples, at least one of the metal layers that form the gate electrode may simply be a planar layer that is substantially parallel to the top surface of the die substrate 2302 and does not include sidewall portions substantially perpendicular to the top surface of the die substrate 2302. In other examples, the gate electrode may consist of a combination of U-shaped structures and planar, non-U-shaped structures. For example, the gate electrode may consist of one or more U-shaped metal layers formed atop one or more planar, non-U-shaped layers.

In some examples, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some examples, a plurality of spacer pairs may be used; for instance, two pairs, three pairs, or four pairs of sidewall spacers may be formed on opposing sides of the gate stack.

The S/D regions 2320 may be formed within the die substrate 2302 adjacent to the gate 2322 of each transistor 2340. The S/D regions 2320 may be formed using an implantation/diffusion process or an etching/deposition process, for example. In the former process, dopants such as boron, aluminum, antimony, phosphorous, or arsenic may be ion-implanted into the die substrate 2302 to form the S/D regions 2320. An annealing process that activates the dopants and causes them to diffuse farther into the die substrate 2302 may follow the ion-implantation process. In the latter process, the die substrate 2302 may first be etched to form recesses at the locations of the S/D regions 2320. An epitaxial deposition process may then be carried out to fill the recesses with material that is used to fabricate the S/D regions 2320. In some implementations, the S/D regions 2320 may be fabricated using a silicon alloy such as silicon germanium or silicon carbide. In some examples, the epitaxially deposited silicon alloy may be doped in situ with dopants such as boron, arsenic, or phosphorous. In some examples, the S/D regions 2320 may be formed using one or more alternate semiconductor materials such as germanium or a group III-V material or alloy. In further examples, one or more layers of metal and/or metal alloys may be used to form the S/D regions 2320.

Electrical signals, such as power and/or input/output (I/O) signals, may be routed to and/or from the devices (e.g., transistors 2340) of the device layer 2304 through one or more interconnect layers disposed on the device layer 2304 (illustrated in FIG. 23 as interconnect layers 2306-2010). For example, electrically conductive features of the device layer 2304 (e.g., the gate 2322 and the S/D contacts 2324) may be electrically coupled with the interconnect structures 2328 of the interconnect layers 2306-2010. The one or more interconnect layers 2306-2010 may form a metallization stack (also referred to as an "ILD stack") 2319 of the IC device 2300.

The interconnect structures 2328 may be arranged within the interconnect layers 2306-2010 to route electrical signals according to a wide variety of designs (in particular, the arrangement is not limited to the particular configuration of interconnect structures 2328 depicted in FIG. 23). Although a particular number of interconnect layers 2306-2010 is depicted in FIG. 23, examples of the present disclosure include IC devices having more or fewer interconnect layers than depicted.

In some examples, the interconnect structures 2328 may include lines 2328a and/or vias 2328b filled with an electrically conductive material such as a metal. The lines 2328a may be arranged to route electrical signals in a direction of a plane that is substantially parallel with a surface of the die substrate 2302 upon which the device layer 2304 is formed. For example, the lines 2328a may route electrical signals in a direction in and out of the page from the perspective of FIG. 23. The vias 2328b may be arranged to route electrical signals in a direction of a plane that is substantially perpendicular to the surface of the die substrate 2302 upon which the device layer 2304 is formed. In some examples, the vias 2328b may electrically couple lines 2328a of different interconnect layers 2306-2010 together.

The interconnect layers 2306-2010 may include a dielectric material 2326 disposed between the interconnect structures 2328, as shown in FIG. 23. In some examples, the dielectric material 2326 disposed between the interconnect structures 2328 in different ones of the interconnect layers 2306-2010 may have different compositions; in other examples, the composition of the dielectric material 2326 between different interconnect layers 2306-2010 may be the same.

A first interconnect layer 2306 (referred to as Metal 1 or "M1") may be formed directly on the device layer 2304. In some examples, the first interconnect layer 2306 may include lines 2328a and/or vias 2328b, as shown. The lines 2328a of the first interconnect layer 2306 may be coupled with contacts (e.g., the S/D contacts 2324) of the device layer 2304.

A second interconnect layer 2308 (referred to as Metal 2 or "M2") may be formed directly on the first interconnect layer 2306. In some examples, the second interconnect layer 2308 may include vias 2328b to couple the lines 2328a of the second interconnect layer 2308 with the lines 2328a of the first interconnect layer 2306. Although the lines 2328a and the vias 2328b are structurally delineated with a line within each interconnect layer (e.g., within the second interconnect layer 2308) for the sake of clarity, the lines 2328a and the vias 2328b may be structurally and/or materially contiguous (e.g., simultaneously filled during a dual-damascene process) in some examples.

A third interconnect layer 2310 (referred to as Metal 3 or "M3") (and additional interconnect layers, as desired) may be formed in succession on the second interconnect layer 2308 according to similar techniques and configurations described in connection with the second interconnect layer 2308 or the first interconnect layer 2306. In some examples, the interconnect layers that are "higher up" in the metallization stack 2319 in the IC device 2300 (i.e., further away from the device layer 2304) may be thicker.

The IC device 2300 may include a solder resist material 2334 (e.g., polyimide or similar material) and one or more conductive contacts 2336 formed on the interconnect layers 2306-2010. In FIG. 23, the conductive contacts 2336 are illustrated as taking the form of bonding pads. The conductive contacts 2336 may be electrically coupled with the interconnect structures 2328 and configured to route the electrical signals of the transistor(s) 2340 to other external devices. For example, solder bonds may be formed on the one or more conductive contacts 2336 to mechanically and/or electrically couple a chip including the IC device 2300 with another component (e.g., a circuit board). The IC device 2300 may include additional or alternate structures to route the electrical signals from the interconnect layers 2306-2010; for example, the conductive contacts 2336 may include other analogous features (e.g., posts) that route the electrical signals to external components.

Figure 24:
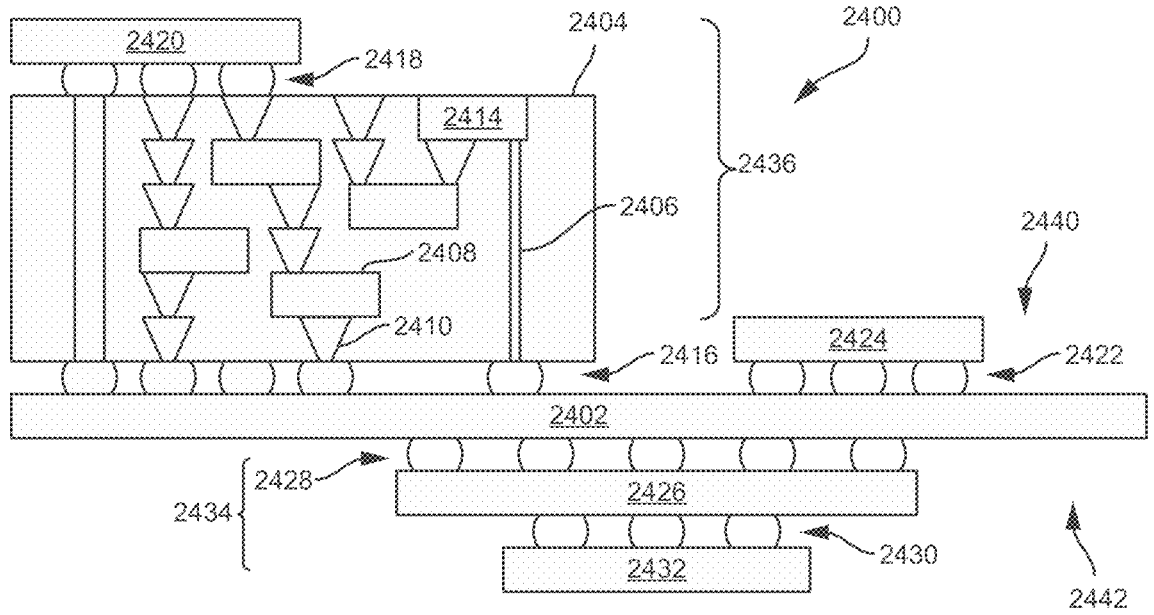
FIG. 24 is a cross-sectional side view of an IC device assembly that may include an IC package constructed in accordance with teachings disclosed herein.

FIG. 24 is a cross-sectional side view of an IC device assembly 2400 that may include the IC package 100 disclosed herein. In some examples, the IC device assembly corresponds to the IC package 100. The IC device assembly 2400 includes a number of components disposed on a circuit board 2402 (which may be, for example, a motherboard). The IC device assembly 2400 includes components disposed on a first face 2440 of the circuit board 2402 and an opposing second face 2442 of the circuit board 2402; generally, components may be disposed on one or both faces 2440 and 2442. Any of the IC packages discussed below with reference to the IC device assembly 2400 may take the form of the example IC package 100 of FIG. 1.

In some examples, the circuit board 2402 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2402. In other examples, the circuit board 2402 may be a non-PCB substrate. In some examples, the circuit board 2402 may be, for example, the circuit board 102 of FIG. 1.

The IC device assembly 2400 illustrated in FIG. 24 includes a package-on-interposer structure 2436 coupled to the first face 2440 of the circuit board 2402 by coupling components 2416. The coupling components 2416 may electrically and mechanically couple the package-on-interposer structure 2436 to the circuit board 2402, and may include solder balls (as shown in FIG. 24), male and female portions of a socket, an adhesive, an underfill material, and/or any other suitable electrical and/or mechanical coupling structure.

The package-on-interposer structure 2436 may include an IC package 2420 coupled to an interposer 2404 by coupling components 2418. The coupling components 2418 may take any suitable form for the application, such as the forms discussed above with reference to the coupling components 2416. Although a single IC package 2420 is shown in FIG. 24, multiple IC packages may be coupled to the interposer 2404; indeed, additional interposers may be coupled to the interposer 2404. The interposer 2404 may provide an intervening substrate used to bridge the circuit board 2402 and the IC package 2420. The IC package 2420 may be or include, for example, a die (the die 2202 of FIG. 22), an IC device (e.g., the IC device 2300 of FIG. 23), or any other suitable component. Generally, the interposer 2404 may spread a connection to a wider pitch or reroute a connection to a different connection. For example, the interposer 2404 may couple the IC package 2420 (e.g., a die) to a set of BGA conductive contacts of the coupling components 2416 for coupling to the circuit board 2402. In the example illustrated in FIG. 24, the IC package 2420 and the circuit board 2402 are attached to opposing sides of the interposer 2404; in other examples, the IC package 2420 and the circuit board 2402 may be attached to a same side of the interposer 2404. In some examples, three or more components may be interconnected by way of the interposer 2404.

In some examples, the interposer 2404 may be formed as a PCB, including multiple metal layers separated from one another by layers of dielectric material and interconnected by electrically conductive vias. In some examples, the interposer 2404 may be formed of an epoxy resin, a fiberglass-reinforced epoxy resin, an epoxy resin with inorganic fillers, a ceramic material, or a polymer material such as polyimide. In some examples, the interposer 2404 may be formed of alternate rigid or flexible materials that may include the same materials described above for use in a semiconductor substrate, such as silicon, germanium, and other group III-V and group IV materials. The interposer 2404 may include metal interconnects 2408 and vias 2410, including but not limited to through-silicon vias (TSVs) 2406. The interposer 2404 may further include embedded devices 2414, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 2404. The package-on-interposer structure 2436 may take the form of any of the package-on-interposer structures known in the art.

The IC device assembly 2400 may include an IC package 2424 coupled to the first face 2440 of the circuit board 2402 by coupling components 2422. The coupling components 2422 may take the form of any of the examples discussed above with reference to the coupling components 2416, and the IC package 2424 may take the form of any of the examples discussed above with reference to the IC package 2420.

The IC device assembly 2400 illustrated in FIG. 24 includes a package-on-package structure 2434 coupled to the second face 2442 of the circuit board 2402 by coupling components 2428. The package-on-package structure 2434 may include a first IC package 2426 and a second IC package 2432 coupled together by coupling components 2430 such that the first IC package 2426 is disposed between the circuit board 2402 and the second IC package 2432. The coupling components 2428, 2430 may take the form of any of the examples of the coupling components 2416 discussed above, and the IC packages 2426, 2432 may take the form of any of the examples of the IC package 2420 discussed above. The package-on-package structure 2434 may be configured in accordance with any of the package-on-package structures known in the art.

Figure 25:
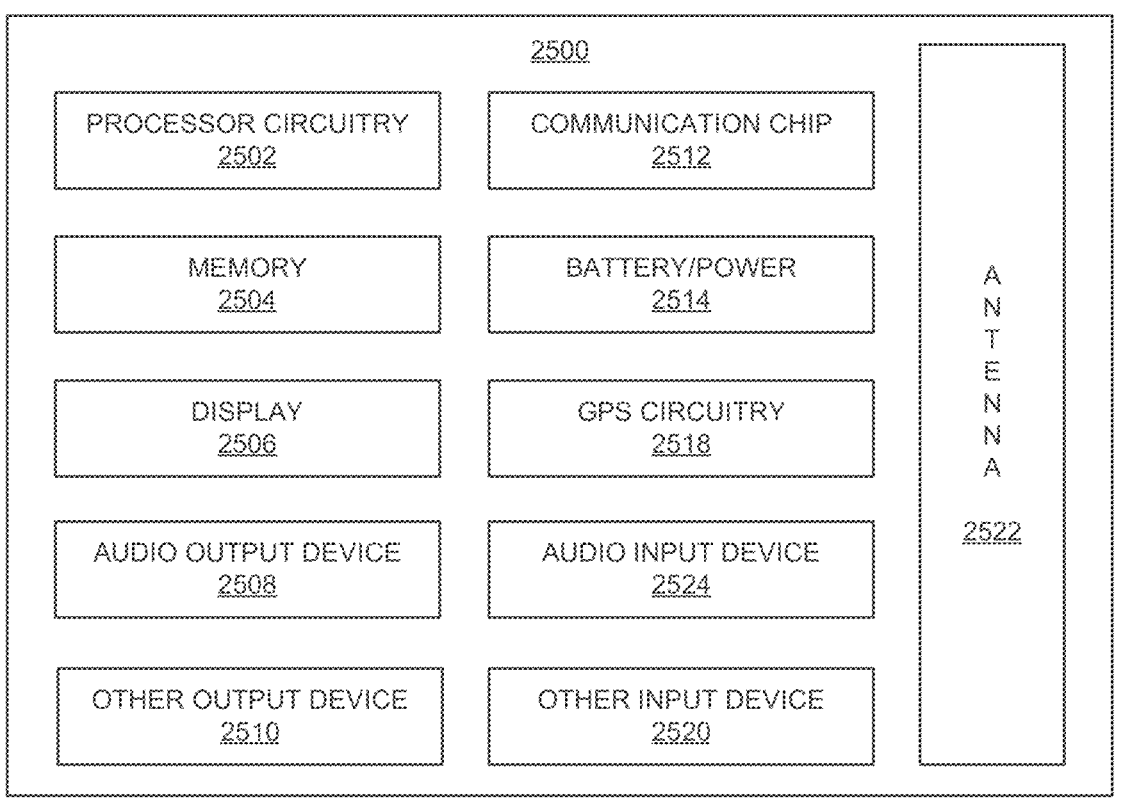
FIG. 25 is a block diagram of an example electrical device that may include an IC package constructed in accordance with teachings disclosed herein.

FIG. 25 is a block diagram of an example electrical device 2500 that may include one or more of the example IC packages 100 of FIG. 1. For example, any suitable ones of the components of the electrical device 2500 may include one or more of the device assemblies 2400, IC devices 2300, or dies 2202 disclosed herein, and may be arranged in the example IC package 100. A number of components are illustrated in FIG. 25 as included in the electrical device 2500, but any one or more of these components may be omitted or duplicated, as suitable for the application. In some examples, some or all of the components included in the electrical device 2500 may be attached to one or more motherboards. In some examples, some or all of these components are fabricated onto a single system-on-a-chip (SoC) die.

Additionally, in various examples, the electrical device 2500 may not include one or more of the components illustrated in FIG. 25, but the electrical device 2500 may include interface circuitry for coupling to the one or more components. For example, the electrical device 2500 may not include a display 2506, but may include display interface circuitry (e.g., a connector and driver circuitry) to which a display 2506 may be coupled. In another set of examples, the electrical device 2500 may not include an audio input device 2524 (e.g., microphone) or an audio output device 2508 (e.g., a speaker, headset, earbuds, etc.), but may include audio input or output device interface circuitry (e.g., connectors and supporting circuitry) to which an audio input device 2524 or audio output device 2508 may be coupled.

The electrical device 2500 may include processor circuitry 2502 (e.g., one or more processing devices). As used herein, the term "processing device" or "processor" may refer to any device or portion of a device that processes electronic data from registers and/or memory to transform that electronic data into other electronic data that may be stored in registers and/or memory. The processor circuitry 2502 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processor circuitry. The electrical device 2500 may include a memory 2504, which may itself include one or more memory devices such as volatile memory (e.g., dynamic random access memory (DRAM)), nonvolatile memory (e.g., read-only memory (ROM)), flash memory, solid state memory, and/or a hard drive. In some examples, the memory 2504 may include memory that shares a die with the processor circuitry 2502. This memory may be used as cache memory and may include embedded dynamic random access memory (eDRAM) or spin transfer torque magnetic random access memory (STT-MRAM).

In some examples, the electrical device 2500 may include a communication chip 2512 (e.g., one or more communication chips). For example, the communication chip 2512 may be configured for managing wireless communications for the transfer of data to and from the electrical device 2500. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some examples they might not.

The communication chip 2512 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2512 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2512 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2512 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2512 may operate in accordance with other wireless protocols in other examples. The electrical device 2500 may include an antenna 2522 to facilitate wireless communications and/or to receive other wireless communications (such as AM or FM radio transmissions).

In some examples, the communication chip 2512 may manage wired communications, such as electrical, optical, or any other suitable communication protocols (e.g., the Ethernet). As noted above, the communication chip 2512 may include multiple communication chips. For instance, a first communication chip 2512 may be dedicated to shorter-range wireless communications such as Wi-Fi or Bluetooth, and a second communication chip 2512 may be dedicated to longer-range wireless communications such as global positioning system (GPS), EDGE, GPRS, CDMA, WiMAX, LTE, EV-DO, or others. In some examples, a first communication chip 2512 may be dedicated to wireless communications, and a second communication chip 2512 may be dedicated to wired communications.

The electrical device 2500 may include battery/power circuitry 2514. The battery/power circuitry 2514 may include one or more energy storage devices (e.g., batteries or capacitors) and/or circuitry for coupling components of the electrical device 2500 to an energy source separate from the electrical device 2500 (e.g., AC line power).

The electrical device 2500 may include a display 2506 (or corresponding interface circuitry, as discussed above). The display 2506 may include any visual indicators, such as a heads-up display, a computer monitor, a projector, a touchscreen display, a liquid crystal display (LCD), a light-emitting diode display, or a flat panel display.

The electrical device 2500 may include an audio output device 2508 (or corresponding interface circuitry, as discussed above). The audio output device 2508 may include any device that generates an audible indicator, such as speakers, headsets, or earbuds.

The electrical device 2500 may include an audio input device 2524 (or corresponding interface circuitry, as discussed above). The audio input device 2524 may include any device that generates a signal representative of a sound, such as microphones, microphone arrays, or digital instruments (e.g., instruments having a musical instrument digital interface (MIDI) output).

The electrical device 2500 may include GPS circuitry 2518. The GPS circuitry 2518 may be in communication with a satellite-based system and may receive a location of the electrical device 2500, as known in the art.

The electrical device 2500 may include any other output device 2510 (or corresponding interface circuitry, as discussed above). Examples of the other output device 2510 may include an audio codec, a video codec, a printer, a wired or wireless transmitter for providing information to other devices, or an additional storage device.

The electrical device 2500 may include any other input device 2520 (or corresponding interface circuitry, as discussed above). Examples of the other input device 2520 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 2500 may have any desired form factor, such as a hand-held or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some examples, the electrical device 2500 may be any other electronic device that processes data.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

From the foregoing, it will be appreciated that example systems, methods, apparatus, and articles of manufacture have been disclosed that enable the localized reduction of dielectric thickness between plates or pads associated with adjacent signal paths or signal lines in a package substrate. This reduced dielectric thickness is achieved by including isolated regions of metal positioned between two adjacent metal layers containing the facing pads or plates. The reduced dielectric thickness results in an increase in mutual capacitance between the signal lines, thereby reducing far end crosstalk therebetween. Such reduction in crosstalk can increase bandwidth and, thus, the performance of IC packages implementing teachings disclosed herein. Disclosed systems, methods, apparatus, and articles of manufacture are accordingly directed to one or more improvement(s) in the operation of a machine such as a computer or other electronic and/or mechanical device.

Example 1 includes an integrated circuit (IC) package comprising a substrate, a first conductive pad in a first metal layer in the substrate, a second conductive pad in a second metal layer in the substrate, the first metal layer adjacent the second metal layer with no intervening metal layers therebetween, and a conductive protrusion extending from the first conductive pad toward the second conductive pad.

Example 2 includes the IC package of example 1, wherein the substrate includes an array of contacts on a first surface of the substrate, the contacts associated with metal in a base metal layer of the substrate, the conductive protrusion electrically connected to a first contact in the array of contacts.

Example 3 includes the IC package of example 2, wherein the first metal layer corresponds to the base metal layer, the first conductive pad corresponds to the first contact, and the second metal layer corresponds to a base-1 metal layer of the substrate.

Example 4 includes the IC package of example 2, wherein the second metal layer corresponds to the base metal layer, the second conductive pad corresponds to the first contact, and the first metal layer corresponds to a base-1 metal layer of the substrate.

Example 5 includes the IC package of example 2, wherein the base metal layer is different than the first metal layer and different than the second metal layer.

Example 6 includes the IC package of any one of examples 2-5, wherein the array of contacts correspond to a land grid array.

Example 7 includes the IC package of any one of examples 2-6, wherein the array of contacts correspond to a ball grid array.

Example 8 includes the IC package of any one of examples 1-7, wherein one of the first conductive pad or the second conductive pad corresponds to a ground plane in the substrate.

Example 9 includes the IC package of any one of examples 1-7, wherein the first conductive pad is associated with a conductive arm electrically connected to a first contact on the substrate, the conductive arm extending along the first metal layer away from the first contact and toward a second contact, the second conductive pad associated with the second contact.

Example 10 includes the IC package of example 9, wherein the conductive arm is a stub having a distal end that is spaced apart from a path for an electrical signal transmitted through the first contact.

Example 11 includes the IC package of example 9, wherein the conductive arm defines a portion of a path for an electrical signal transmitted through the first contact.

Example 12 includes the IC package of any one of examples 1-11, wherein the substrate is a package substrate of the IC package, the package substrate exposed to an exterior of the IC package.

Example 13 includes the IC package of any one of examples 1-11, wherein the substrate is an interposer disposed within the IC package, the interposer mounted to a separate package substrate of the IC package.

Example 14 includes the IC package of any one of examples 1-13, wherein the conductive protrusion extends from the first conductive pad to the second conductive pad at least 25% of a distance between the first and second metal layers.

Example 15 includes an apparatus comprising a substrate including a first surface and a second surface opposite the first surface, an array of contacts on the first surface of the substrate, a semiconductor die mounted on the second surface of the substrate, the contacts associated with signal paths through the substrate to electrically couple the semiconductor die with the contacts, a first conductive pad electrically connected to a first signal path of the signal paths, and a second conductive pad electrically connected to a second signal path of the signal paths, the second signal path different than the first signal path, a distance between the first and second conductive pads being less than a distance between adjacent metal layers in the substrate.

Example 16 includes the apparatus of example 15, wherein at least one of the first conductive pad or the second conductive pad corresponds to one of the contacts.

Example 17 includes the apparatus of any one of examples 15 or 16, wherein the first conductive pad is electrically connected to a first contact of the array of contacts through a conductive arm extending away from the first contact.

Example 18 includes the apparatus of example 17, wherein the conductive arm is electrically connected to the first contact independent of a via stack electrically connected to the first contact, the via stack defining the first signal path.

Example 19 includes the apparatus of example 17, wherein the conductive arm is electrically connected to the first contact through a metal via in a via stack electrically connected to the first contact, the via stack defining the first signal path.

Example 20 includes the apparatus of any one of examples 15-19, wherein the first and second conductive pads are positioned to reduce crosstalk between the first and second signal paths.

Example 21 includes an apparatus, comprising a package substrate, a plurality of metal layers within the package substrate, the metal layers including metal defining metal interconnects through the package substrate, a plurality of dielectric layers, different ones of the dielectric layers between adjacent ones of the metal layers, and a metal plate positioned between first metal in a first metal layer and second metal in a second metal layer, the first and second metal layers adjacent one another, the metal plate in contact with the first metal.

Example 22 includes the apparatus of example 21, wherein the first metal is electrically connected to a first one of the metal interconnects and the second metal is electrically connected to a second one of the metal interconnects.

Example 23 includes the apparatus of any one of examples 21 or 22, wherein the metal plate is an integral extension of the first metal.

Example 24 includes the apparatus of any one of examples 21-23, wherein the metal plate is a first metal plate, and the second metal is a second metal plate, the first and second metal plates have a matching shape.

Example 25 includes the apparatus of any one of examples 21-24, wherein the metal plate has a thickness that is at least half a distance between the first and second metal layers.

The following claims are hereby incorporated into this Detailed Description by this reference. Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

What is claimed is:

1. An integrated circuit (IC) package comprising:
a substrate including an array of contacts on a first surface of the substrate, the contacts associated with metal in a base metal layer of the substrate;
a first conductive pad in a first metal layer in the substrate;
a second conductive pad in a second metal layer in the substrate, the first metal layer adjacent the second metal layer with no intervening metal layers therebetween, the base metal layer different than the first metal layer and different than the second metal layer; and
a conductive protrusion extending from the first conductive pad toward the second conductive pad.

2. The IC package of claim 1, wherein the conductive protrusion is electrically connected to a first contact in the array of contacts.

3. The IC package of claim 2, wherein the first metal layer corresponds to the base metal layer, the first conductive pad corresponds to the first contact, and the second metal layer corresponds to a base-1 metal layer of the substrate.

4. The IC package of claim 2, wherein the second metal layer corresponds to the base metal layer, the second conductive pad corresponds to the first contact, and the first metal layer corresponds to a base-1 metal layer of the substrate.

5. The IC package of claim 2, wherein the array of contacts corresponds to a land grid array.

6. The IC package of claim 2, wherein the array of contacts corresponds to a ball grid array.

7. The IC package of claim 1, wherein one of the first conductive pad or the second conductive pad corresponds to a ground plane in the substrate.

8. The IC package of claim 1, wherein the first conductive pad is associated with a conductive arm electrically connected to a first contact on the substrate, the conductive arm extending along the first metal layer away from the first contact and toward a second contact, the second conductive pad associated with the second contact.

9. The IC package of claim 8, wherein the conductive arm is a stub having a distal end that is spaced apart from a path for an electrical signal transmitted through the first contact.

10. The IC package of claim 8, wherein the conductive arm defines a portion of a path for an electrical signal transmitted through the first contact.

11. The IC package of claim 1, wherein the substrate is a package substrate of the IC package, the package substrate exposed to an exterior of the IC package.

12. The IC package of claim 1, wherein the substrate is an interposer disposed within the IC package, the interposer mounted to a separate package substrate of the IC package.

13. The IC package of claim 1, wherein the conductive protrusion extends from the first conductive pad to the second conductive pad at least 25% of a distance between the first and second metal layers.

14. An apparatus comprising:
a substrate including a first surface and a second surface opposite the first surface;
an array of contacts on the first surface of the substrate;
a semiconductor die mounted on the second surface of the substrate, the contacts associated with signal paths through the substrate to electrically couple the semiconductor die with the contacts;
a first conductive pad electrically connected to a first signal path of the signal paths, the first conductive pad electrically connected to a first contact of the array of contacts through a conductive arm extending away from the first contact, the conductive arm electrically connected to the first contact through a metal via in a via stack electrically connected to the first contact, the via stack defining the first signal path; and
a second conductive pad electrically connected to a second signal path of the signal paths, the second signal path different than the first signal path, a distance between the first and second conductive pads being less than a distance between adjacent metal layers in the substrate.

15. The apparatus of claim 14, wherein at least one of the first conductive pad or the second conductive pad corresponds to one of the contacts.

16. The apparatus of claim 14, wherein the conductive arm is electrically connected to the first contact independent of a via stack electrically connected to the first contact, the via stack defining the first signal path.

17. The apparatus of claim 14, wherein the first and second conductive pads are positioned to reduce crosstalk between the first and second signal paths.

18. An apparatus, comprising:
a package substrate;
a plurality of metal layers within the package substrate, the metal layers including metal defining metal interconnects through the package substrate;
a plurality of dielectric layers, different ones of the dielectric layers between adjacent ones of the metal layers; and
a metal plate between first metal in a first metal layer and second metal in a second metal layer, the first and second metal layers adjacent one another, the metal plate in contact with the first metal.

19. The apparatus of claim 18, wherein the first metal is electrically connected to a first one of the metal interconnects and the second metal is electrically connected to a second one of the metal interconnects.

20. The apparatus of claim 18, wherein the metal plate is an integral extension of the first metal.

21. The apparatus of claim 18, wherein the metal plate is a first metal plate, and the second metal is a second metal plate, the first and second metal plates have a matching shape.

22. The apparatus of claim 18, wherein the metal plate has a thickness that is at least half a distance between the first and second metal layers.

* * * * *